(12) United States Patent
Dahl

(10) Patent No.: US 7,117,469 B1
(45) Date of Patent: Oct. 3, 2006

(54) METHOD OF OPTIMIZING PLACEMENT AND ROUTING OF EDGE LOGIC IN PADRING LAYOUT DESIGN

(75) Inventor: Peter Dahl, Sunnyvale, CA (US)

(73) Assignee: Magma Design Automation, Inc., Santa Clara, CA (US)

( * ) Notice: Subject to any disclaimer, the term of this patent is extended or adjusted under 35 U.S.C. 154(b) by 821 days.

(21) Appl. No.: 10/264,691

(22) Filed: Oct. 3, 2002

Related U.S. Application Data

(60) Provisional application No. 60/352,920, filed on Jan. 28, 2002, provisional application No. 60/334,137, filed on Nov. 28, 2001.

(51) Int. Cl.
*G06F 17/50* (2006.01)

(52) U.S. Cl. .................. 716/11; 716/6; 716/9
(58) Field of Classification Search ............. 716/1, 716/6, 9, 11, 12
See application file for complete search history.

(56) References Cited

U.S. PATENT DOCUMENTS 6,714,903 B1 *  3/2004  Chu et al. ................. 716/6

* cited by examiner

*Primary Examiner*—Thuan Do
(74) *Attorney, Agent, or Firm*—Fenwick & West LLP

(57) ABSTRACT

Methods for generating a padring layout design are described. These methods utilize automation while still allowing customization. Automation is emphasized as much as possible so that more time can be used to solve the various problems that make each padring layout design unique. A framework in which regular patterns can be described, replicated, and tailored is provided. The padring is broken down into zones in which slots having bumps/bond pads areas, I/O cell areas, and/or edge logic cell areas are laid out in a regular pattern through an instantiation process. Edge logic, which is comprised of standard cells, is pulled from the core of the chip because these cells couple directly to I/O cells and are critical for timing. The framework allows the bumps/bond pads, I/O cells, and edge logic cells to be laid out in respective bumps/bond pads areas, I/O cell areas, and/or edge logic cell areas according to algorithms associated with the patterns and using a variety of maps which associate the logical netlist with the physical layout design.

64 Claims, 33 Drawing Sheets

BGA Padring

Linear Padring

Bump/Bond Pad Names Map

```
# example 1 (slot number, bond pad name)
0, CH2
1, CH1
2, CG2
3, CG1
4, CF2
5, CG1
...
```

← 1800B

Bump/Bond Pad Names Map

```
# example 2 (bond pad name, coordinate of bond pad)
CH2   -6500.0   -6700.0
CH1   -6700.0   -6700.0
CG2   -6500.0   -6500.0
CG1   -6700.0   -6500.0
CF2   -6500.0   -6300.0
CF1   -6700.0   -6300.0
...
```

I/O Hints Map

Slot or Bump/Bond Pad / I/O Cells slot_0, Net2
CH66, IO3
/^slot_[1-2]$/, /IO4|Net5/
!^slot_[3-4]$!, /^IO6$|IO7/
/^slot_5$|^slot_6$/, /IO[8-9]/
/CG66|CD66/, /IO10|IO11/
/^slot_7$|CE66/, IO?2, IO?3
...

I/O Map

Slot or Bump/Bond Pad / I/O Cell comment
M13, vss
L13, vdd
K13, io_instance_2
J13, io_instance_3
4, no_bond
5, bond_only
...

Edge Logic Map

<u>Slot or Bump/Bond Pad</u> / <u>Standard Cells</u>

0, no_cells
1, no_cells
K13, /Std[0]/
sh format for next line
J13, S?d1
K14, /Std3/
J14, /Std[4-5]/
sh format for next line
K15, S?d6, S*d7
sh format for next line
J15, Std[89]
...

FIG. 21

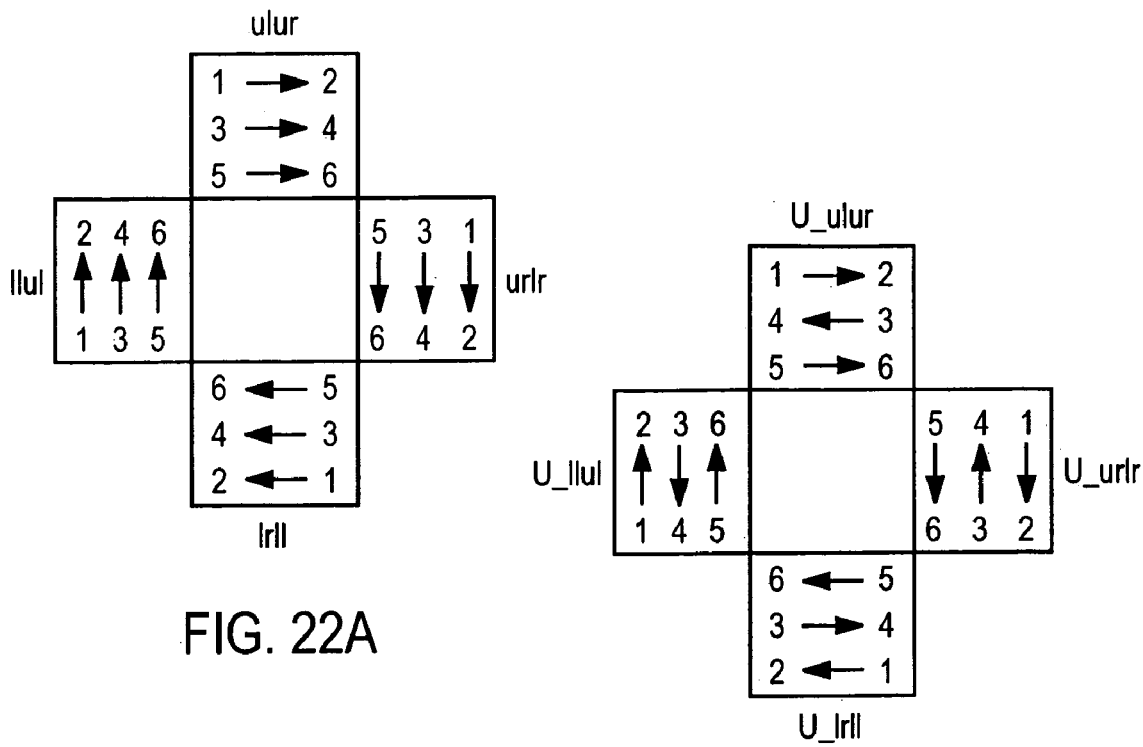
FIG. 22A
FIG. 22B
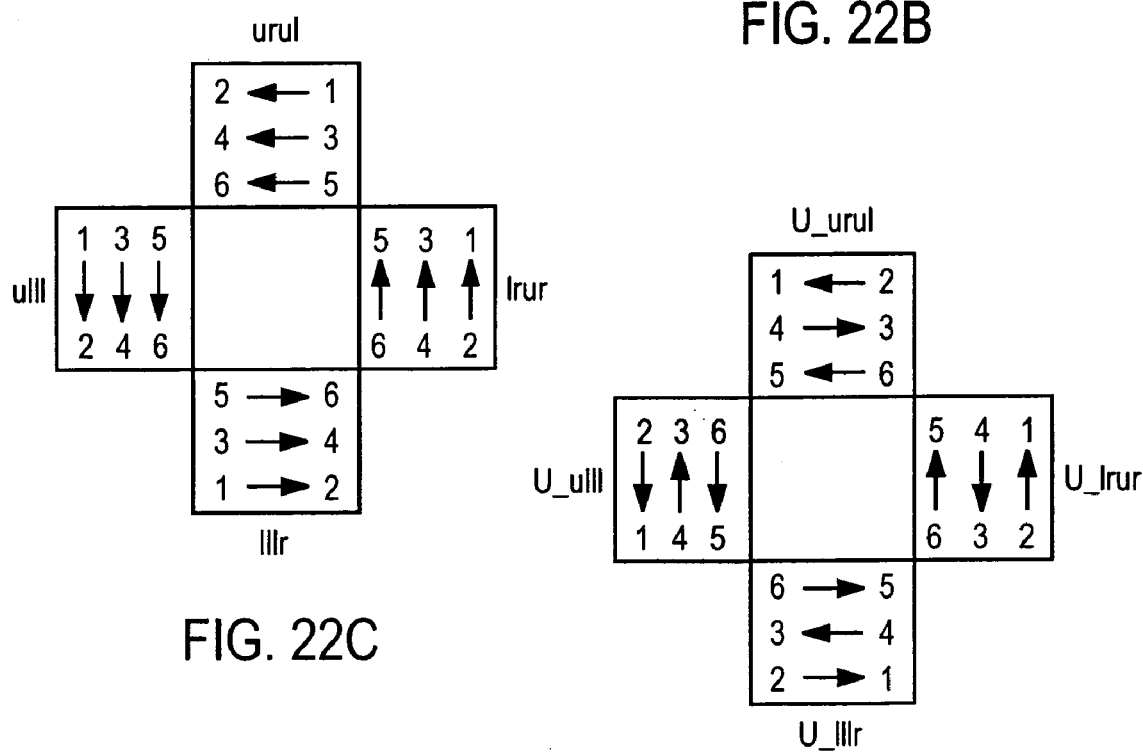
FIG. 22C
FIG. 22D

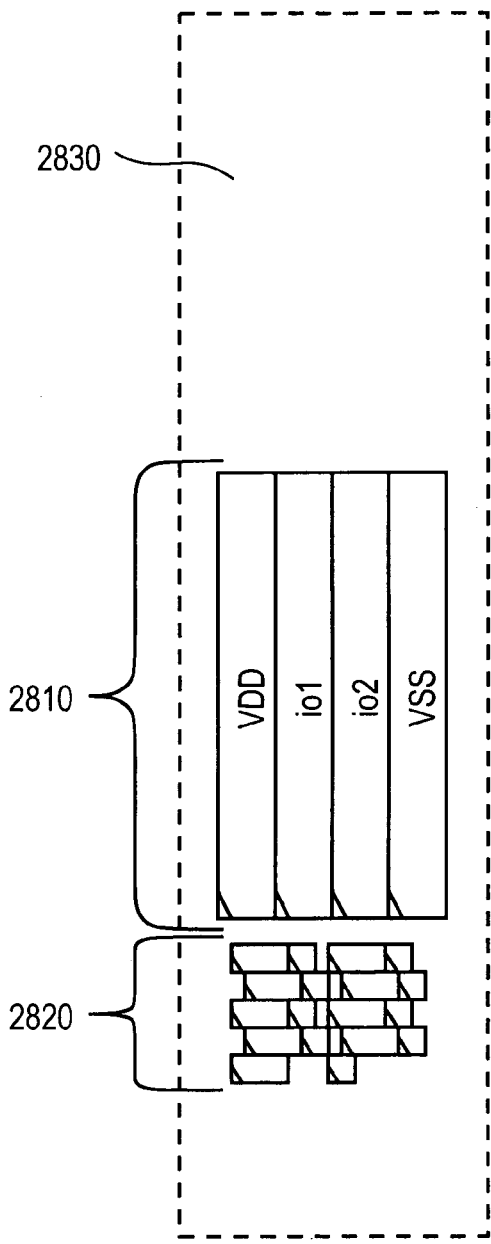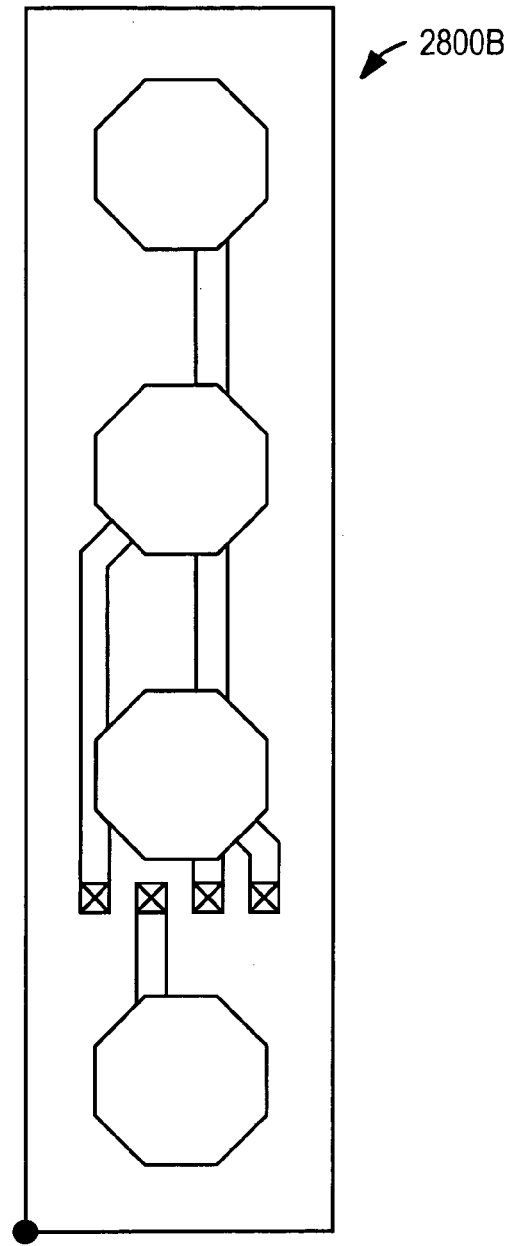
I/O, Edge Logic Placement
Bump to I/O Route Covercell
FIG. 28A
FIG. 28B

METHOD OF OPTIMIZING PLACEMENT AND ROUTING OF EDGE LOGIC IN PADRING LAYOUT DESIGN

RELATED U.S. APPLICATION

This patent application claims priority to the copending provisional patent application Ser. No. 60/334,137, entitled "PADRING DESIGN," and with filing date Nov. 28, 2001. This patent application claims priority to the copending provisional patent application Ser. No. 60/352,920, entitled "PADRING GENERATION," and with filing date Jan. 28, 2002.

BACKGROUND OF THE INVENTION

1. Field of the Invention

Embodiments of the present invention generally relate to generating chip layout designs. More particularly, embodiments of the present invention relate to generating the padring layout design.

2. Related Art

Typically, the integrated circuit (or chip) design process begins with a specification which describes the functionality of the chip and may include a variety of constraints. Then, during a logic design phase, the logical implementation of the integrated circuit is determined. Several operations are performed to obtain a logical representation of the integrated circuit. Generally, EDA software tools use register transfer logic (RTL) to represent the integrated circuit. However, additional EDA software tools may be used.

After completing the logic design phase, the chip undergoes a physical layout design phase. Typically, the output of the logic design phase is a netlist, which is then used in the physical layout design phase. Here, EDA software tools layout the integrated circuit to obtain a layout representation of the physical components in the integrated circuit, whereas the layout representation indicates the manner in which the integrated circuit will be fabricated on a semiconductor wafer. A variety of operations are performed on the layout of the integrated circuit.

At the end of the physical layout design phase, the final layout representation of the semiconductor chip (in which the integrated circuit is implemented is sent to a semiconductor manufacturing plant. Typically, the semiconductor chip is fabricated and then coupled to a package, whereas an electrical coupling is established between the padring of the semiconductor chip and the package.

During the physical layout design phase, the padring layout design is generated. The padring is an area where differing electrical, timing, physical, and logical views of the physical layout design come together. In particular, the padring is an interface for input signals, output signals, power signals, and ground signals between a semiconductor chip and off-chip components. FIG. 1 illustrates a conventional padring layout design 10. When combined with the trend of increasing pin counts, fast clocks, and tight design schedules, the complexity of generating the padring layout design can be overwhelming. In order to satisfy this variety of constraints, a high level of control in partitioning, placement, and routing the various aspects of the padring layout design is required. This is often done by hand and can be a laborious process that does not lend itself to making changes in a repeatable manner.

Moreover, laying out a padring with a high pin count, fast clock, low skew, and/or tight design schedule is a daunting task that can occupy a designer for months. The sheer amount of details that must be tracked and incorporated into the padring layout design is a management task in and of itself. Figuring out a pinout that will route in the package and still satisfy the constraints on the die (or chip) involves knowledge in many areas. High clock rates and tight skew requirements demand precision and regularity in the layout of I/O cells and associated routes in the padring. Considerations dealing with the die such as the distance from the core of the die to the I/O area in the padring can disclose the fact that the distance is often too far to guarantee timing. On the package side, the layout of the bumps/bond pads in the padring has to be coordinated with the package to deliver a system that works together. Last minute changes and design schedule pressure can help this problem become a nightmare unless a systematic approach is used.

SUMMARY OF THE INVENTION

Methods for generating a padring layout design are described. In particular, these methods utilize automation while still allowing customization. The task of generating the padring layout design is greatly aided by software configured to generate padring layout designs.

The variety of problems encountered when laying out padrings are addressed. Automation is emphasized as much as possible so that more time can be used to solve the various problems that make each padring layout design unique. A framework in which regular patterns can be described, replicated, and tailored is provided. The padring is broken down into zones in which slots having bumps/bond pads areas, I/O cell areas, and/or edge logic cell areas are laid out in a regular pattern through an instantiation process. Edge logic, which is comprised of standard cells, is pulled from the core of the chip because these cells couple directly to I/O cells and are critical for timing. The framework allows the bumps/bond pads, I/O cells, and edge logic cells to be laid out in respective bumps/bond pads areas, I/O cell areas, and/or edge logic cell areas according to algorithms associated with the patterns and using a variety of maps which associate the logical netlist with the physical layout design.

In an embodiment, an editor and a GUI and a perl environment are provided which allow the resulting padring layout to be tailored to handle custom layout or exceptions in the patterns. This provides an environment for generating prototypes quickly to see if a pinout is feasible and determining packaging requirements. The padring layout design is generated in conjunction with package routing/selection and partitioning/floorplanning of the chip so that the chip-package-board system will work together. Finally, patterns can be saved and modified for use with future chips in the same chip family. This allows padring layout designs to be utilized despite shrinking and variability in future chip designs.

These and other advantages of the present invention will no doubt become apparent to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

FIG. 18B illustrates a bump/bond pad names map in a second format in accordance with an embodiment of the present invention.

FIG. 19 illustrates an I/O hints map in accordance with an embodiment of the present invention.

FIG. 20 illustrates an I/O map in accordance with an embodiment of the present invention.

FIG. 21 illustrates an edge logic map in accordance with an embodiment of the present invention.

FIGS. 22A–22D illustrate a plurality of arrangements for placing objects in accordance with an embodiment of the present invention.

FIG. 28A illustrates I/O cells and edge logic placement in accordance with an embodiment of the present invention.

FIG. 28B illustrates a bump-to-I/O route cover cell in accordance with an embodiment of the present invention.

Figure 1:
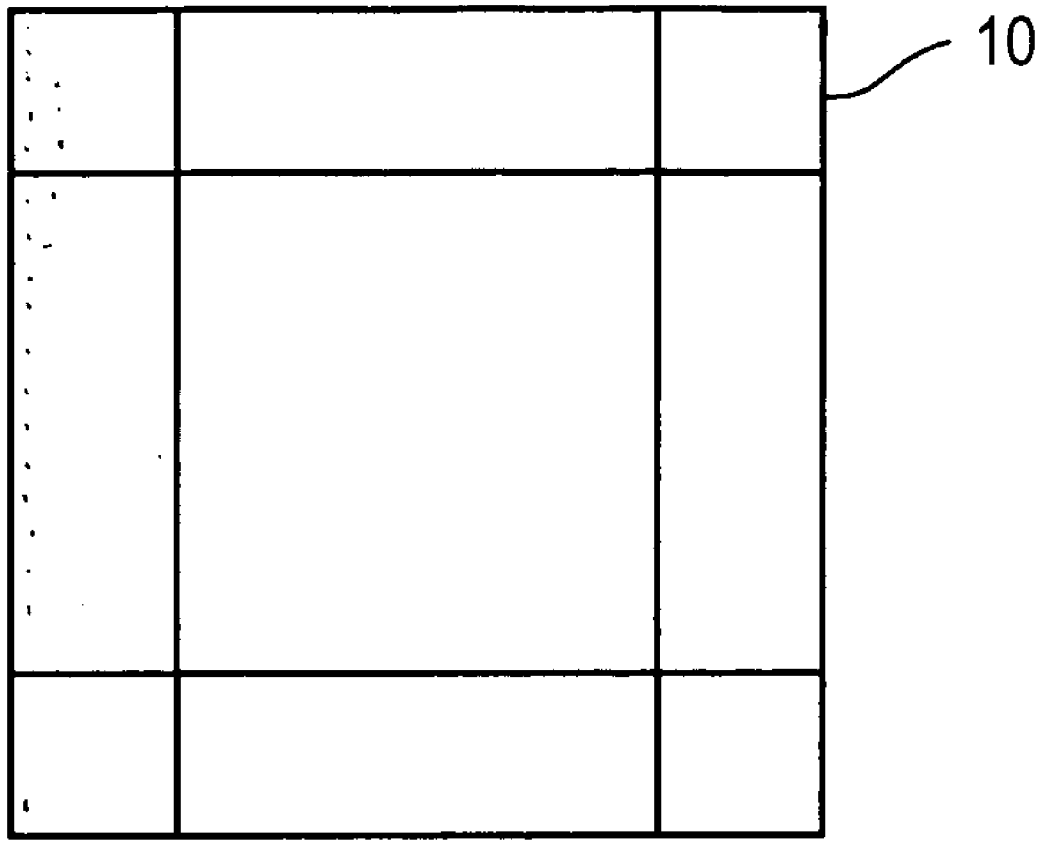
FIG. 1 illustrates a conventional padring layout design.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details.

Notation and Nomenclature

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proved convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, a variety of terms are discussed that refer to the actions and processes of an electronic system or a computer system, or other electronic computing device/system. The computer system or similar electronic computing device manipulates and transforms data represented as physical (electronic) quantities within the computer system's registers and memories into other data similarly represented as physical quantities within the computer system memories or registers or other such information storage, transmission, or display devices. The present invention is also well suited to the use of other computer systems such as, for example, optical, mechanical, or quantum computers.

Exemplary Computer System Environment

Aspects of the present invention can be implemented or executed on a computer system or any other computational system. Although a variety of different computer systems can be used with the present invention, an exemplary computer system 100 is shown in FIG. 2.

Figure 2:
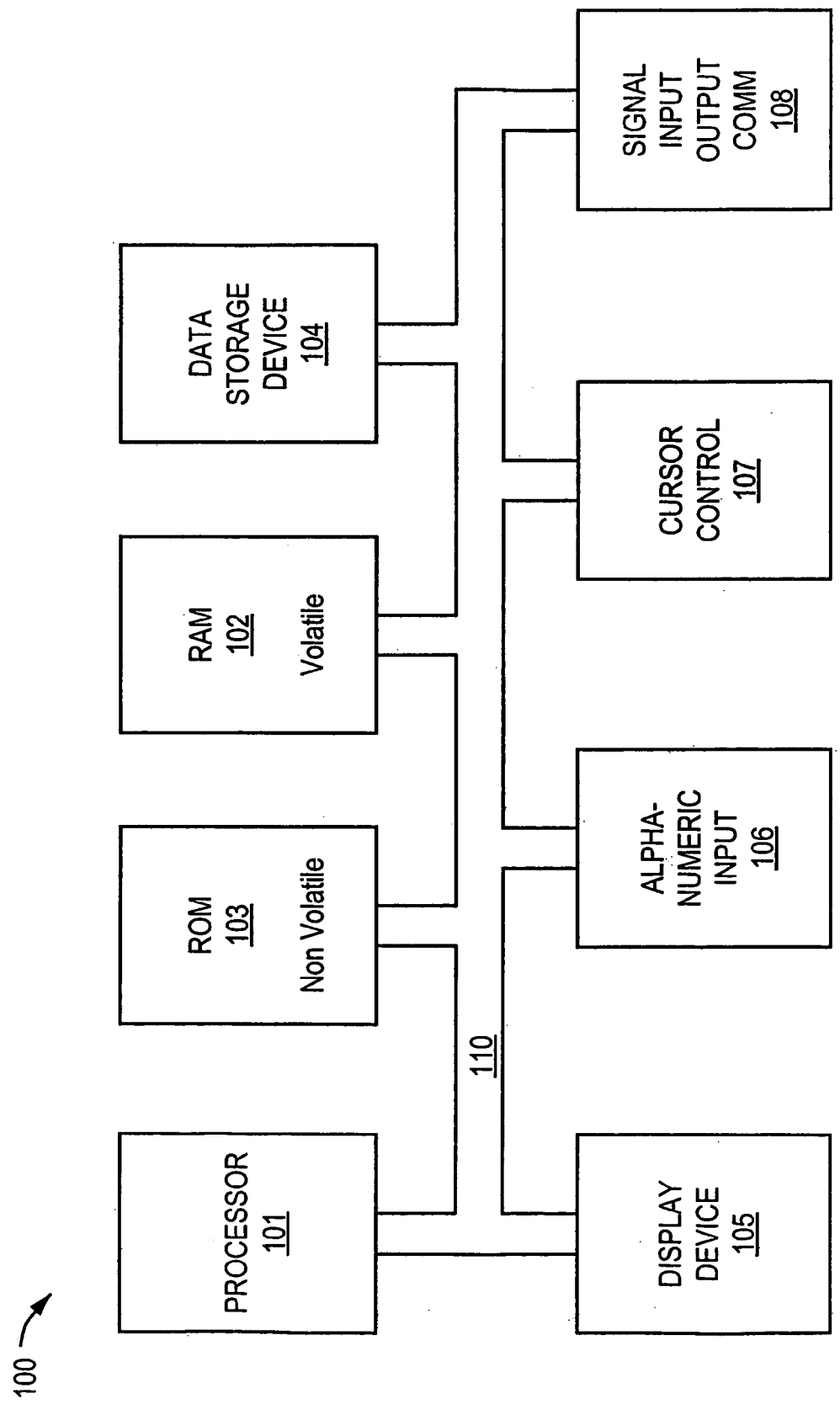
FIG. 2 illustrates an exemplary computer system in which embodiments of the present invention can be practiced.

With reference to FIG. 2, portions of the present invention are comprised of computer-readable and computer executable instructions which reside, for example, in computer-usable media of an electronic system such as the exemplary computer system 100. FIG. 2 illustrates an exemplary computer system 100 on which embodiments of the present invention may be practiced. It is appreciated that the computer system 100 of FIG. 2 is exemplary only and that the present invention can operate within a number of different computer systems including general-purpose computer systems and embedded computer systems.

Computer system 100 includes an address/data bus 110 for communicating information, a central processor 101 coupled with bus 110 for processing information and instructions, a volatile memory 102 (e.g., random access memory RAM) coupled with the bus 110 for storing information and instructions for the central processor 101 and a non-volatile memory 103 (e.g., read only memory ROM) coupled with the bus 110 for storing static information and instructions for the processor 101. Exemplary computer system 100 also includes a data storage device 104 ("disk subsystem") such as a magnetic or optical disk and disk drive coupled with the bus 110 for storing information and instructions. Data storage device 104 can include one or more removable magnetic or optical storage media (e.g., diskettes, tapes) which are computer-readable memories. Memory units of computer system 100 include volatile memory 102, non-volatile memory 103 and data storage device 104.

Exemplary computer system 100 can further include a signal generating device 108 (e.g., a network interface card "NIC") coupled to the bus 110 for interfacing with other computer systems. Also included in exemplary computer system 100 of FIG. 2 is an alphanumeric input device 106 including alphanumeric and function keys coupled to the bus 110 for communicating information and command selections to the central processor 101. Exemplary computer system 100 also includes a cursor control or directing device 107 coupled to the bus 110 for communicating user input information and command selections to the central processor 101. A display device 105 can also be coupled to the bus 110 for displaying information to the computer user. Display device 105 may be a liquid crystal device, other flat panel display, cathode ray tube, or other display device suitable for creating graphic images and alphanumeric characters recognizable to the user. Cursor control device 107 allows the user to dynamically signal the two-dimensional movement of a visible symbol (cursor) on a display screen of display device 105. Many implementations of cursor control device 107 are known in the art including a trackball, mouse, touch pad, joystick or special keys on alphanumeric input device 106 capable of signaling movement of a given direction or manner of displacement. Alternatively, it will be appreciated that a cursor an be directed and/or activated via input from alphanumeric input device 108 using special keys and key sequence commands.

Padring Layout Design

Methods for generating padring layout designs in an automated manner that is easily configurable, repeatable, and customizable are described. In an embodiment, a set of baseline patterns can be selected from a template library and then adapted based on the needs of the specific design situation. Alternatively, new patterns can be formed since an editor and a GUI and a perl environment are provided which allow the resulting padring layout to be tailored to handle custom layout or exceptions in the patterns. Patterns can define one or more slots, each slot having a bumps/bond pads area, an I/O area, and/or an edge logic area. Moreover, patterns are then repeated over particular padring areas using an instantiation process to create slots. The padring layout design and the slots can be customized. Later, bumps/bond pads, I/O cells, and edge logic cells are placed in the respective bumps/bond pads areas, I/O areas, and edge logic areas of the slots. This pattern generation, instantiation to create slots, and customizing/editing provide several benefits. By using these methods for generating padring layout designs, the user can quickly prototype a padring layout for floorplanning, experiment with what-if scenarios, and implement a detailed padring layout design ready for sign-off in an efficient manner.

The variety of problems and constraints encountered when laying out padrings are addressed by the present invention. One of the problems is the distance from a bump/bond pad to the first/last flip-flop can be large and variable; trying to achieve closure on timing in this environment is difficult and problematic. Pulling selected logic out of the core and associating it with a particular I/O cell solves that problem but creates many others such as how this logic will be placed, routed, and powered.

Another problem is that the bumps/bond pads are placed on a grid that is different from the standard cell grid in the core. This can cause misalignment in power straps and cells placed in each area. The placement of the bumps/bond pads and I/O cells is tied to the bump/bond pad pitch and has more to do with the package than features on the chip.

There are parts of a padring that are repetitious and so making changes to these parts at the last minute is tedious and error prone. There are other parts that are asymmetric or unique (i.e. PLL placement and hookup, shielding for source synchronous buses, temperature compensation or impedance matching logic) and must be handcrafted for a particular design. Changing one-of-a-kind parts is easier since they often are fewer in number but their layout could still benefit from an automated padring layout approach.

When choosing a package size and vendor, it is useful to explore various pinouts, pitches, and number of rows of bumps/bond pads. The price point and routing of the package must balance against the floorplan, pinout, and associated timing on the chip. Once a package is chosen and sent off to be manufactured, another challenge is to maintain that pinout while the chip is laid out and the design matures and goes through final timing adjustments.

Library changes at the last minute can change whether pins are pulled to the edge of cells or inset, their timing characteristics, and how they connect to the rest of the design. A small change in a library can translate into a large change in the padring layout design.

The automated padring layout approach of the present invention is well suited to handle the problems and constraints described above by providing a systematic and organized approach to generating the padring layout designs.

Figure 3A:
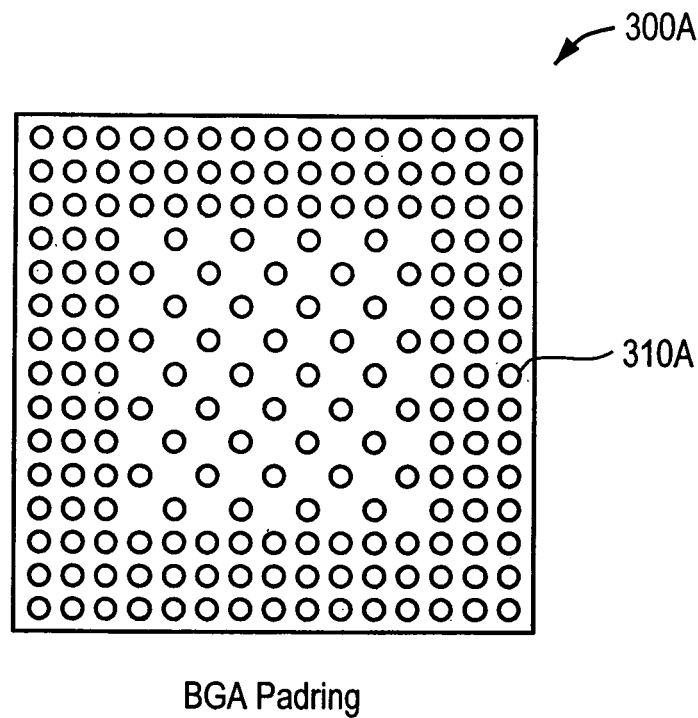
FIG. 3A illustrates a BGA padring in accordance with an embodiment of the present invention.
Figure 3B:
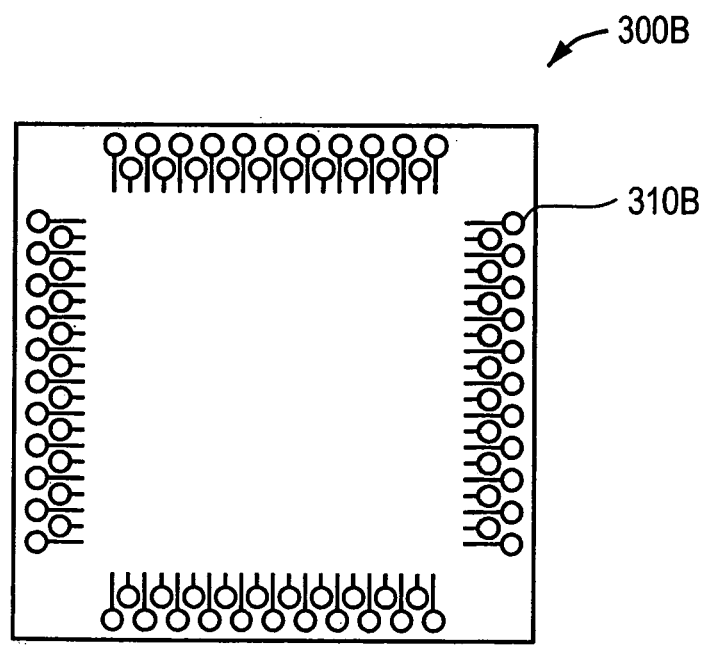
FIG. 3B illustrates a linear padring in accordance with an embodiment of the present invention.

A BGA (ball grid array) padring 300A in accordance with an embodiment of the present invention is depicted in FIG. 3A. FIG. 3B illustrates a linear padring 300B in accordance with an embodiment of the present invention. The BGA padring 300A and the linear padring 300B are types of padrings. The type of padring is determined by how the bumps 310A/bond pads 310B are laid out over the die (or chip). The advantage of the BGA padring 300A is the high pin density that can be achieved. It should be understood that the present invention can be used to generate layouts for the BGA padring 300A, the linear padring 300B, and other types of padrings.

Figure 4A:
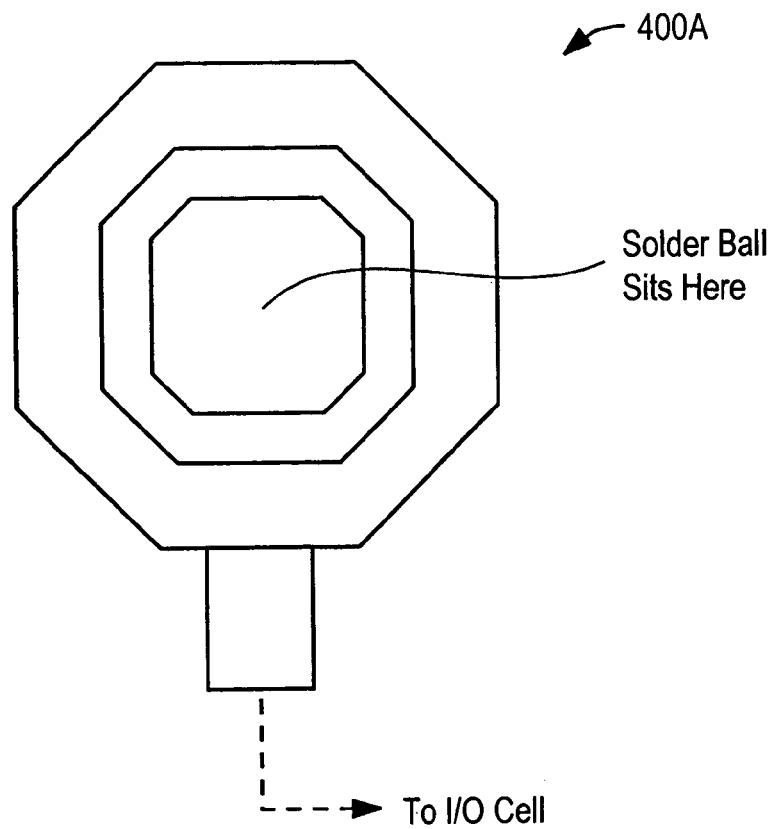
FIG. 4A illustrates a bump in accordance with an embodiment of the present invention.

FIG. 4A illustrates a bump 400A in accordance with an embodiment of the present invention. The bump 400A is the metal that electrically couples the die to the package. Sometimes the term "pad" is used instead of bump. Typically, a solder ball is melted between the bump 400A and the package substrate. In practice, the solder ball may not be a ball at all but rather a cylinder created by the last few layers of the fabrication process. Generally, the bump 400A is on the highest layer of metal (e.g., m7). In the padring layout, the bump 400A is represented as an octagonal shape.

Figure 4B:
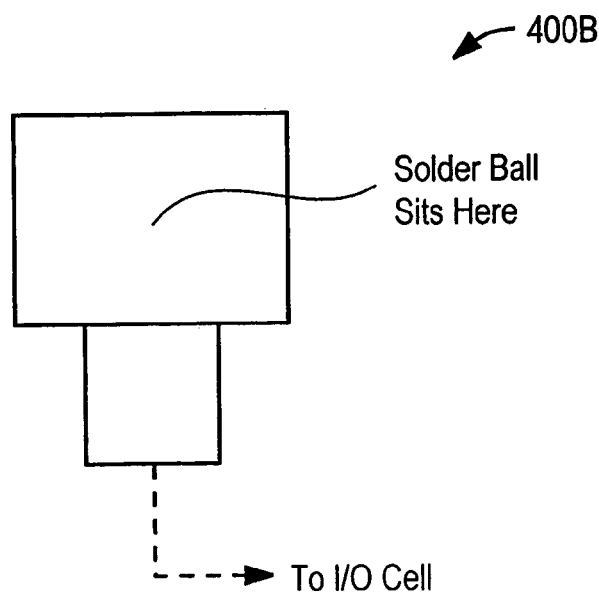
FIG. 4B illustrates a bond pad in accordance with an embodiment of the present invention.

A bond pad 400B in accordance with an embodiment of the present invention is shown in FIG. 4B. The bond pad 400B is the metal that electrically couples the die to the package. A bond wire is soldered to the bond pad 400B and then coupled to the package. In the padring layout, the bond pad 400B is represented as a variant on the shape of a "T".

Typically, the bump 400A and the bond pad 400B are each coupled to an I/O cell via a route metal. Although the description of the present invention will focus on the layout of a BGA padring 300A (FIG. 3A) having bumps 310A, the discussion will be applicable to the layout of a linear padring 300B (FIG. 3B) having bond pads 310B.

Figure 5:
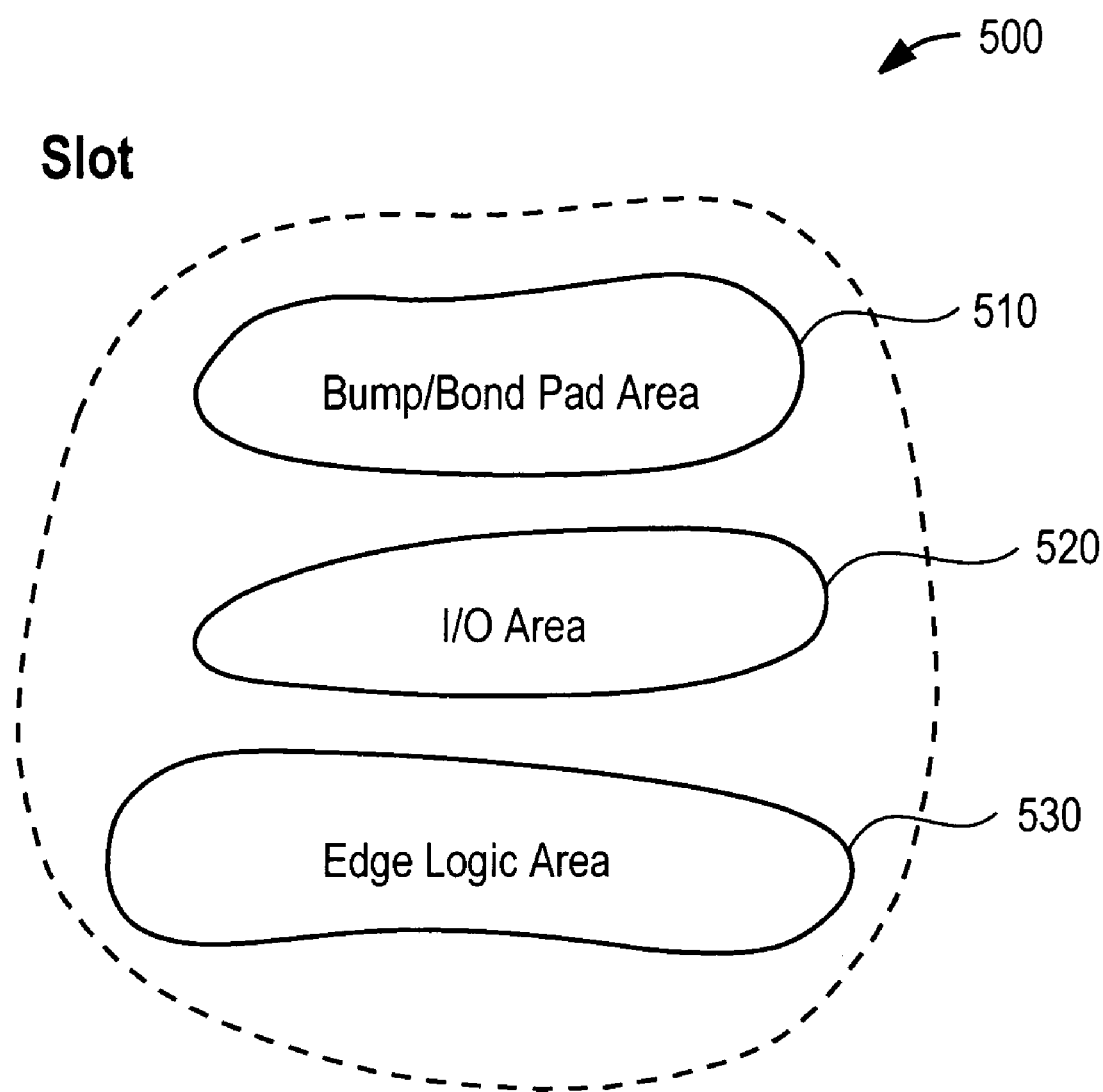
FIG. 5 illustrates a slot in accordance with an embodiment of the present invention.

FIG. 5 illustrates a slot 500 in accordance with an embodiment of the present invention. A slot 500 is an abstraction that may have a bump/bond pad area 510, an I/O area 520, and/or an edge logic area 530. The slot 500 has its own origin and coordinate system. In particular, the slot 500 acts like a placeholder by reserving particular areas of the padring layout for a particular purpose. Slots 500 are generated and placed in an automated manner in the padring area. Later, bumps/bond pads are placed in the bump/bond pad areas 510 of the slots 500, I/O cells are placed in the I/O areas 520 of the slots 500, and standard cells are placed in the edge logic areas 530 of the slots 500. As will be described below, the edge logic area 530 is an area for placing standard cells that need to be placed close to the corresponding I/O cell to satisfy timing constraints. These standard cells are moved from the core of the chip and placed in the padring area of the chip since the core is too far from the I/O cell.

Associated with each area 510–530 within the slot 500 can be a grid, ordering function, orientation, and placement algorithm (or arrangement) chosen from a library. Each slot 500 is given a name when it is generated and can also be given an alias to reference it. The slot 500 provides the capability to represent everything needed to bring one signal, power, or ground into the chip. Each area 510–530 is optional. For example, a power pad (bump or bond pad) may not need an I/O area 520 or an edge logic area 530. Also, the pad (bump or bond pad) may be missing, for example a N/C (no connect). There can be more than one of each if needed. In essence, the slot 500 describes areas where the bump/bond pad metal, I/O cell, and standard cells are placed and how they are placed. As will be described below, patterns are used to define the slot 500 and replicate the slot 500 in the padring area. A pattern can define more than one slot 500. Through an instantiation process, the slots 500 are created by using the pattern over and over again in the padring area. The instantiation of slots 500 is what fixes their bump/bond pad area 510, I/O area 520, and edge logic area 530 to a specific position on the padring area of the chip. In an embodiment, an editor and a GUI and a perl environment are provided which allow the resulting padring layout to be tailored to handle custom layout or exceptions in the patterns and to form the patterns.

Figure 6:
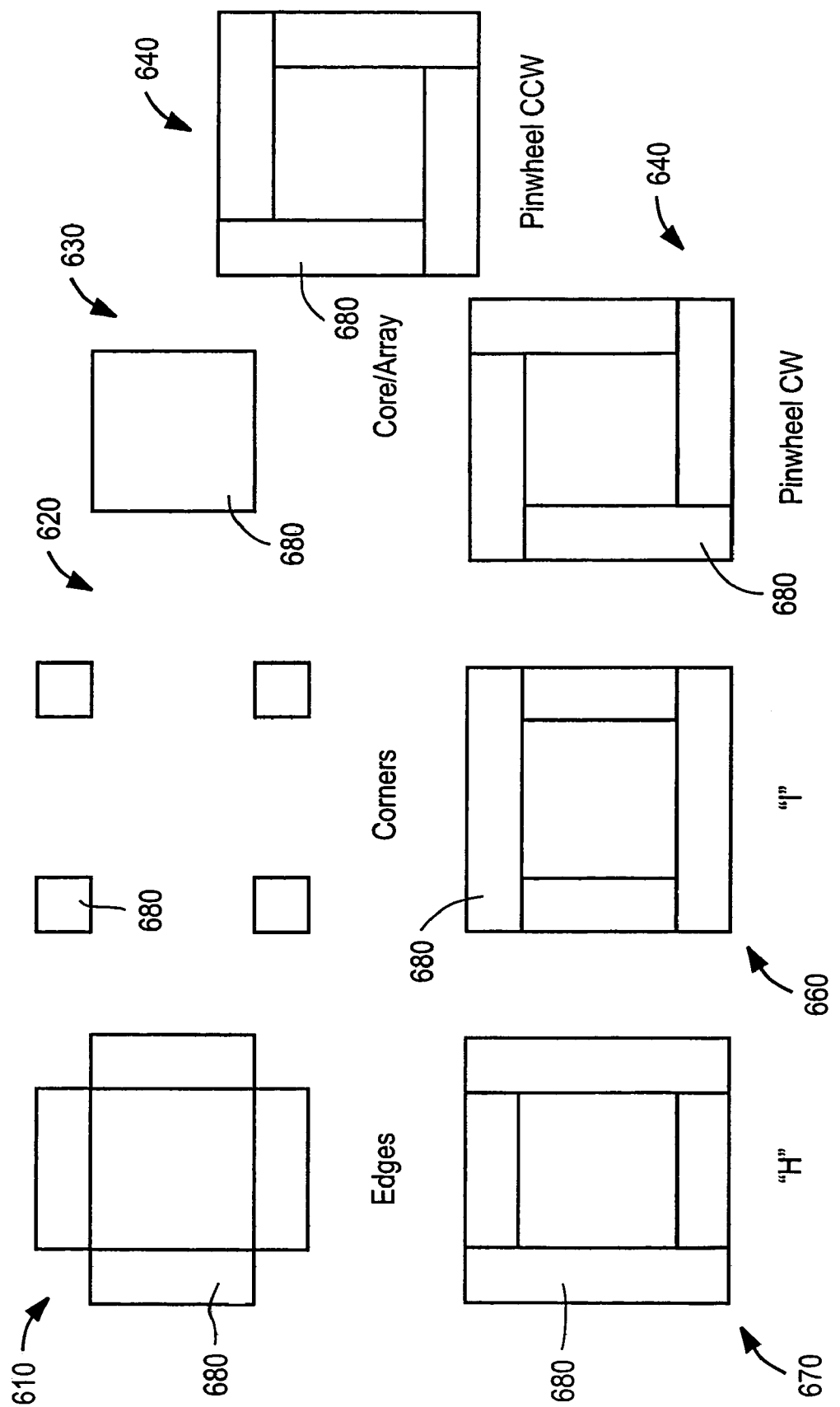
FIG. 6 illustrates a plurality of styles in accordance with an embodiment of the present invention, showing zones of each style.

FIG. 6 illustrates a plurality of styles 610–670 in accordance with an embodiment of the present invention, showing zones 680 of each style 610–670. Each style 610–670 is comprised of one or more zones 680. In particular, the style 610–670 specifies how the padring area is divided so that the multiple patterns can be used to populate the padring area with slots. The chip does not have to be square. These styles 610–670 can be modified to the shape of the chip. Other styles are possible. Each style 610–670 indicates regions of the padring that can be populated with slots in an automated manner using one or more patterns as templates.

By varying the style and combining different patterns, the user has control over where the I/O cells and the standard cells are placed for each bump/bond pad on the die. Often a combination of styles is required to generate the appropriate padring layout design. For example, a padring layout design may have an outer pinwheel CW style 650, an inner style for a power ring comprised of the edges style 610 and the corners style 620, and a core/array style 630 over the core of the die for slots that have power/ground bumps.

Each zone 680 is the area of the padring in which patterns are used to create slots using an instantiation process. Any layout regularity in the zone is determined and incorporated into the pattern for the zone. The pattern is used as a template to populate each zone 680 with slots. An orientation and placement algorithm (or arrangement) can be associated with each zone 680 for controlling how the slots are oriented and placed in each zone 680. Additionally, a symmetry attribute can be associated with each zone 680.

Figure 7:
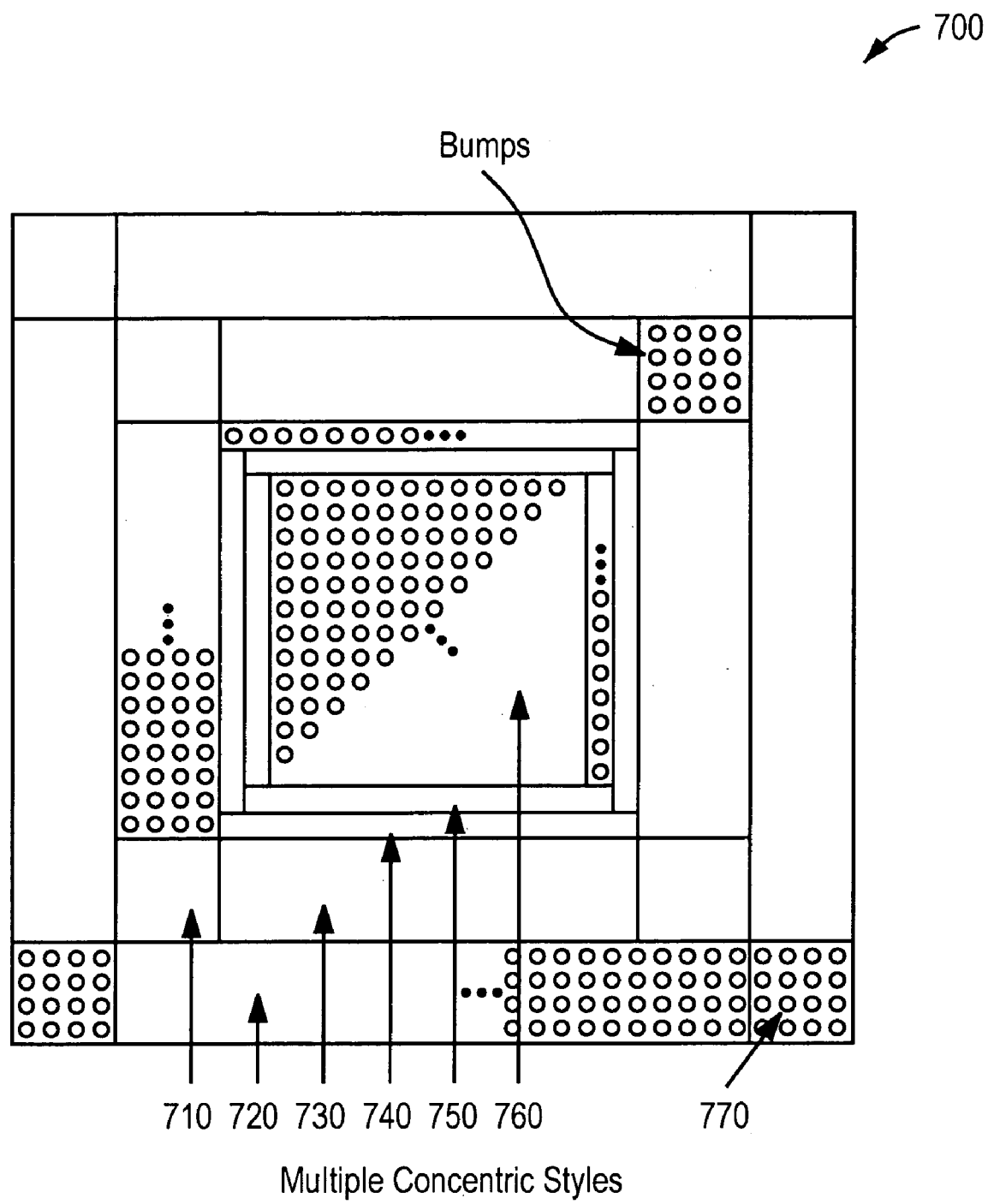
FIG. 7 illustrates a padring layout design having a plurality of concentric styles in accordance with an embodiment of the present invention.

FIG. 7 illustrates a padring layout design 700 having a plurality of concentric styles 710–770 in accordance with an embodiment of the present invention. The padring layout design 700 has a first corners style 770, a first edges style 720, a second corners style 710, a second edges style 730, a first "l" style 740, a second "l" style 750, and a core/array style 760.

Figure 8A:
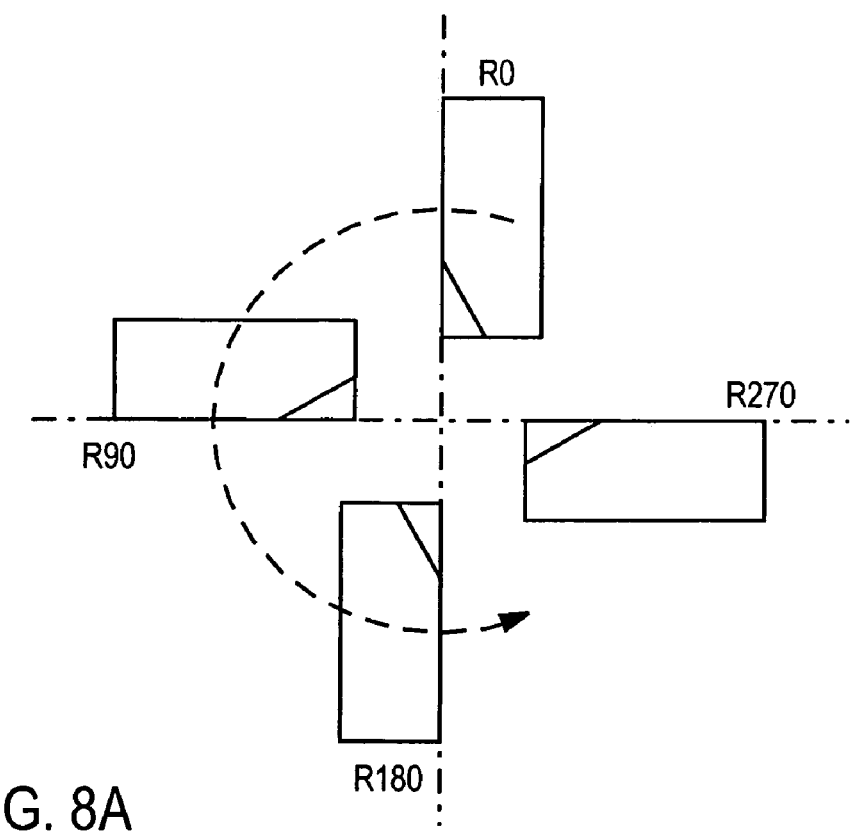
FIG. 8A illustrates a plurality of rotation values for an orientation attribute in accordance with an embodiment of the present invention.

A plurality of rotation values for an orientation attribute in accordance with an embodiment of the present invention are illustrated in FIG. 8A. The orientation attribute is associated with the areas of slots and zones. FIG. 8A depicts a plurality of rotational values R0, R90, R180, and R270 and the corresponding orientation of an object. Other orientations are possible.

Figure 8B:
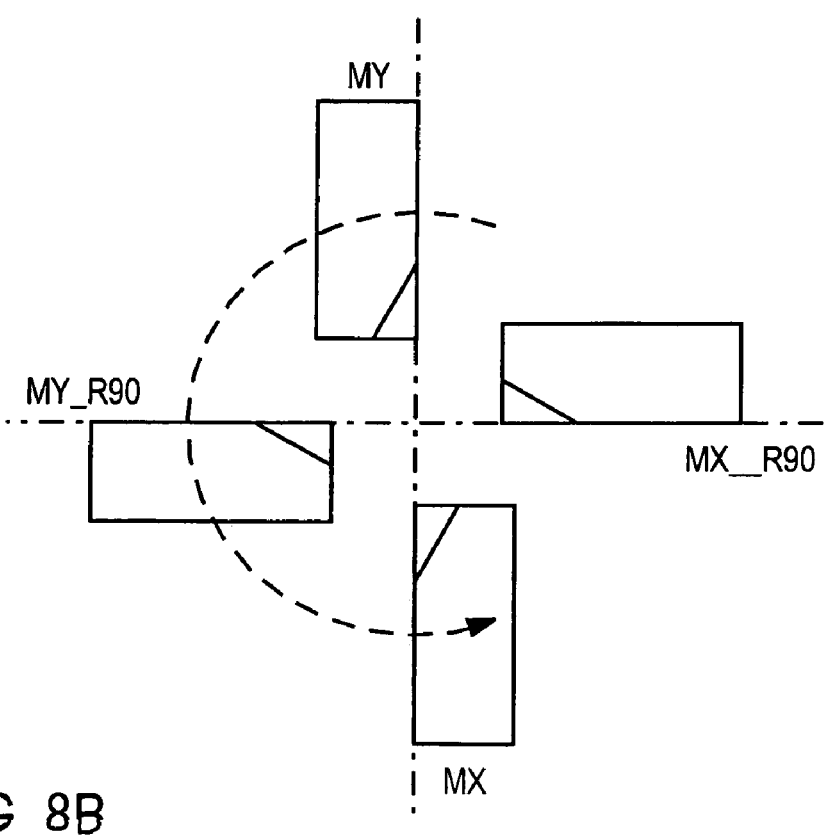
FIG. 8B illustrates a plurality of mirror values for an orientation attribute in accordance with an embodiment of the present invention.

FIG. 8B illustrates a plurality of mirror values for an orientation attribute in accordance with an embodiment of the present invention. The orientation attribute is associated with the areas of slots and zones. FIG. 8B depicts a plurality of mirror values MY, MY_R90, MX, and MX_R90 and the corresponding orientation of an object. Other orientations are possible.

Figure 9A:
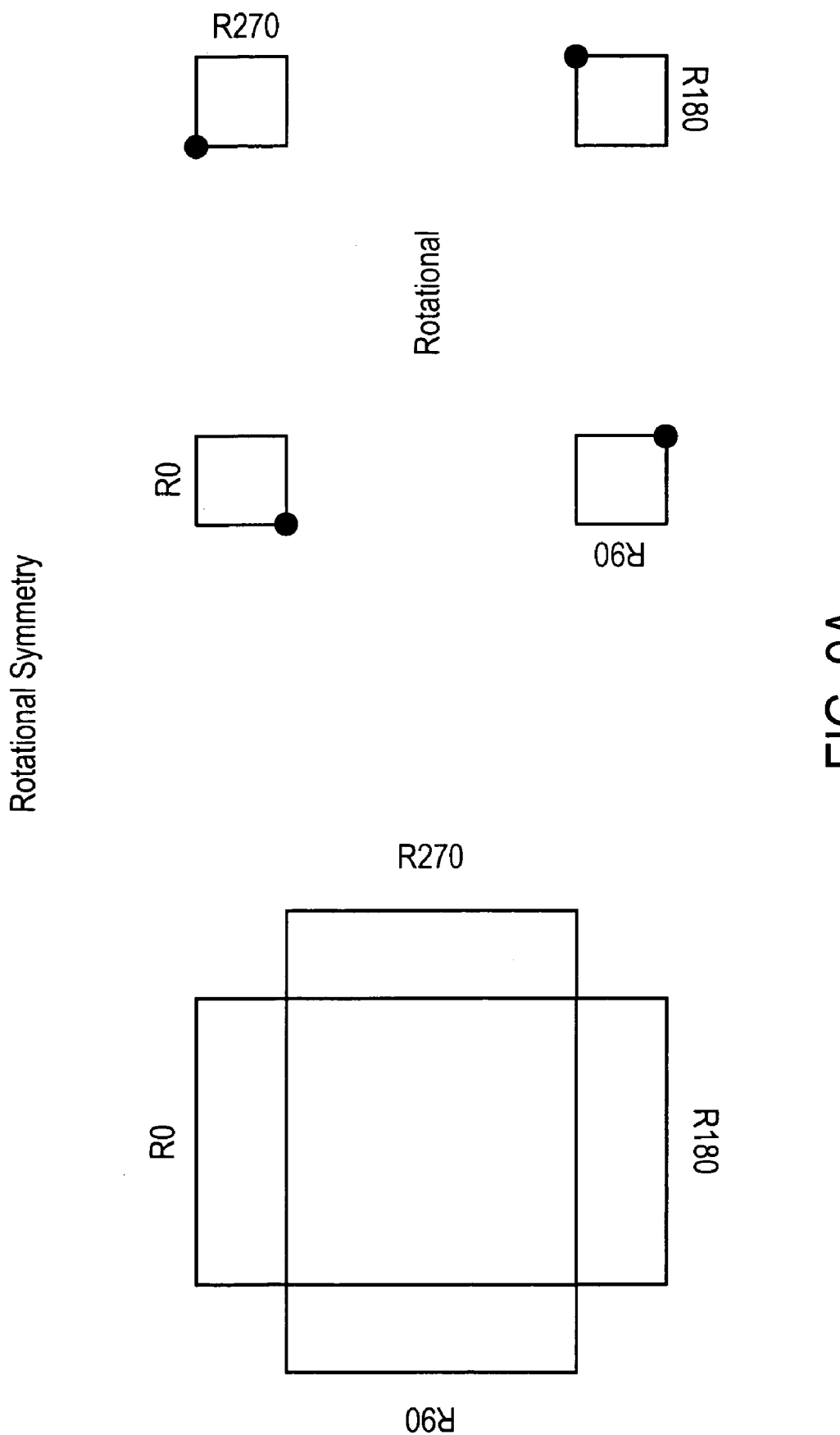
FIG. 9A illustrates a plurality of rotation symmetry values for a symmetry attribute in accordance with an embodiment of the present invention.

A plurality of rotation symmetry values for a symmetry attribute in accordance with an embodiment of the present invention are depicted in FIG. 9A. The symmetry attribute is associated with the zones. FIG. 9A depicts a plurality of rotational symmetry values R0, R90, R180, and R270 and the corresponding orientation of the zone. Rotational symmetry is where the orientation of a zone is a rotation of another zone.

Figure 9B:
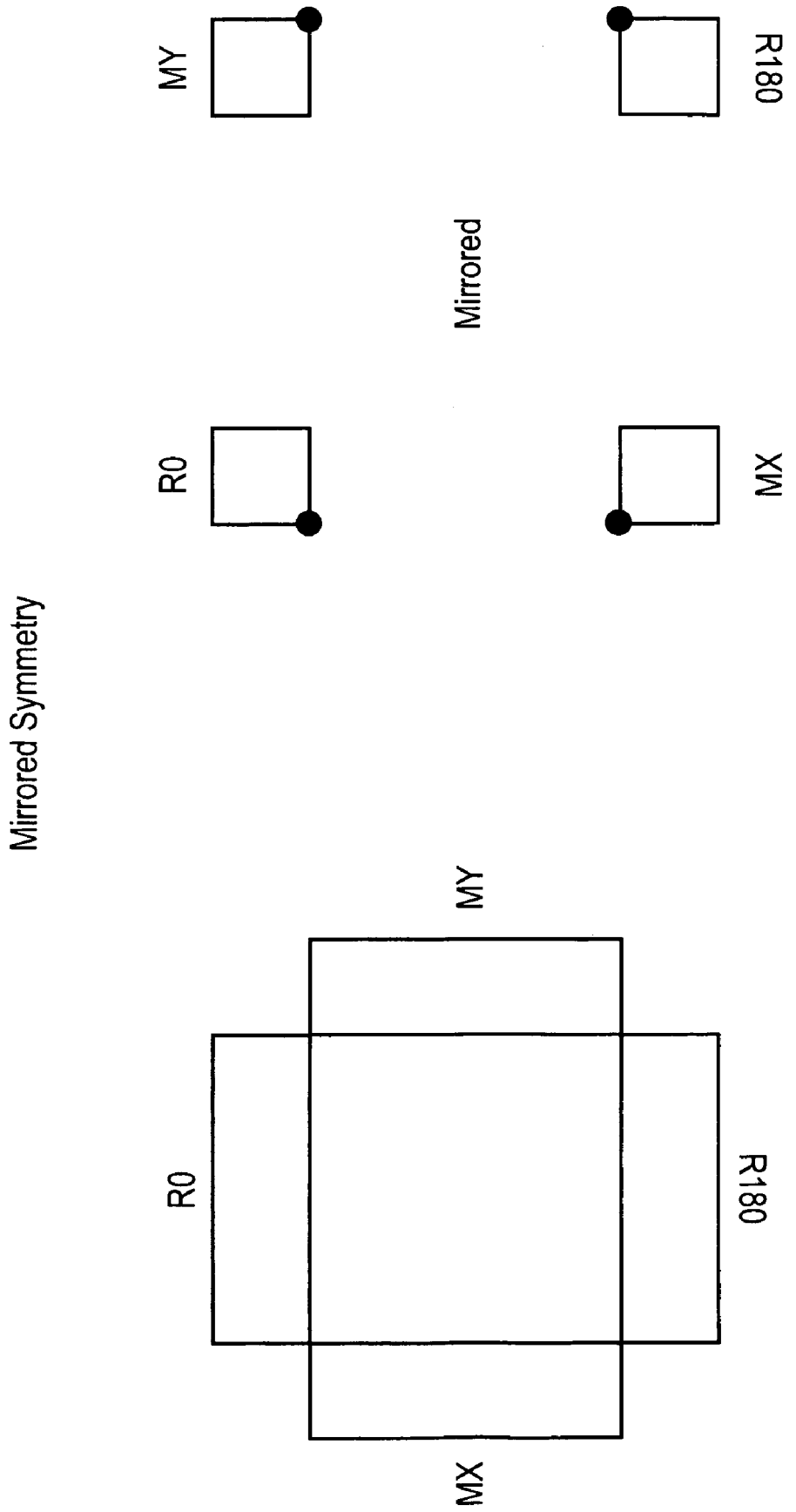
FIG. 9B illustrates a plurality of mirrored symmetry values for a symmetry attribute in accordance with an embodiment of the present invention.

FIG. 9B illustrates a plurality of mirrored symmetry values for a symmetry attribute in accordance with an embodiment of the present invention. The symmetry attribute is associated with the zones. FIG. 9B depicts a plurality of mirrored symmetry values R0, MY (mirrored about the Y-axis), MX (mirrored about the X-axis), R180 (mirrored about the X-axis and Y-axis) and the corresponding orientation of the zone. Mirrored symmetry is where patterns are laid down in a zone and then laid down as a mirror image in the other zones.

Figure 10:
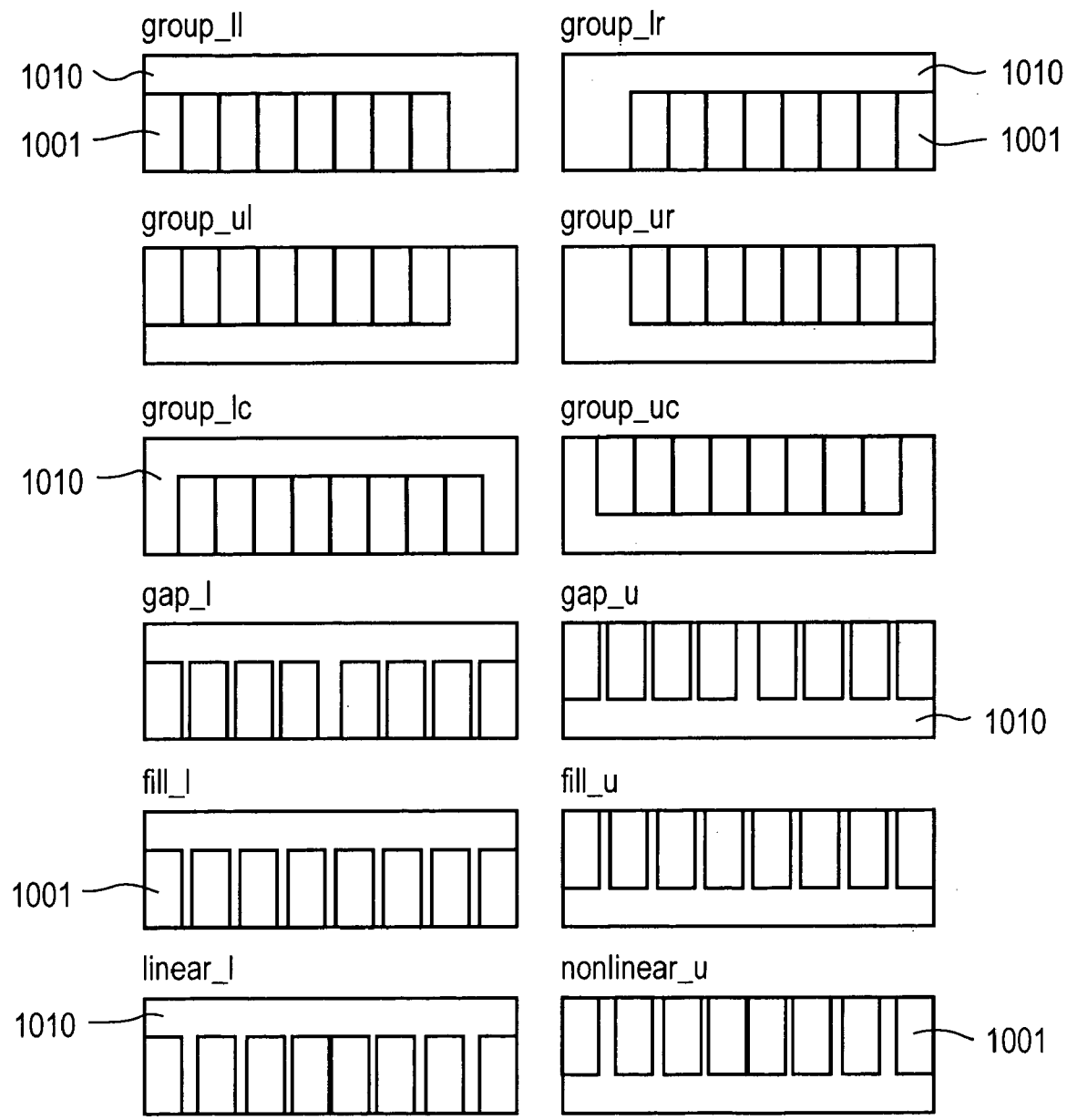
FIG. 10 illustrates a plurality of spacing values for a spacing attribute in accordance with an embodiment of the present invention.

A plurality of spacing values for a spacing attribute in accordance with an embodiment of the present invention are illustrated in FIG. 10. The spacing attribute is associated with the zones 1010. As slots 1001 are instantiated in each zone 1010 using the pattern, there are several ways the slots 1001 can be placed. The spacing attribute controls how the slots 1001 are spread out or grouped together. The "group" spacing places the slots 1001 abutted to each other. FIG. 10 depicts a plurality of "group" spacing values group_ll, group_lr, group_ul, group_ur, group_lc, and group_uc and the corresponding placement of slots 1001 in the zone 1010.

The "gap" spacing places a fixed sized gap between slots as they are placed. Any extra space is centered. FIG. 10 depicts a plurality of "gap" spacing values gap_l, and gap_u and the corresponding placement of slots 1001 in the zone 1010. The "fill" spacing spreads out the slots 1001 as evenly as possible with the end slots 1001 touching the edges of the zone 1010. Due to gridding, there might still be a slightly larger gap in the middle where any excess area will be placed. FIG. 10 depicts a plurality of "fill" spacing values fill_l, and fill_u and the corresponding placement of slots 1001 in the zone 1010.

Moreover, for wire-bonded packages, it is desirable to place the slots farther apart near the corners of the die and closer together near the middle of the edge. This helps to alleviate problems due to the angle the wire makes with the edge. This is called "non-linear" spacing. FIG. 10 depicts a plurality of "non-linear" spacing values nonlinear_l, and nonlinear_u and the corresponding placement of slots 1001 in the zone 1010. An editor can be used to further customize the placement of the slots 1001 in the zone 1010. Additionally, a graphical user interface (GUI) can be used to further customize the placement of the slots 1001 in the zone 1010. Other spacings are possible.

Figure 11:
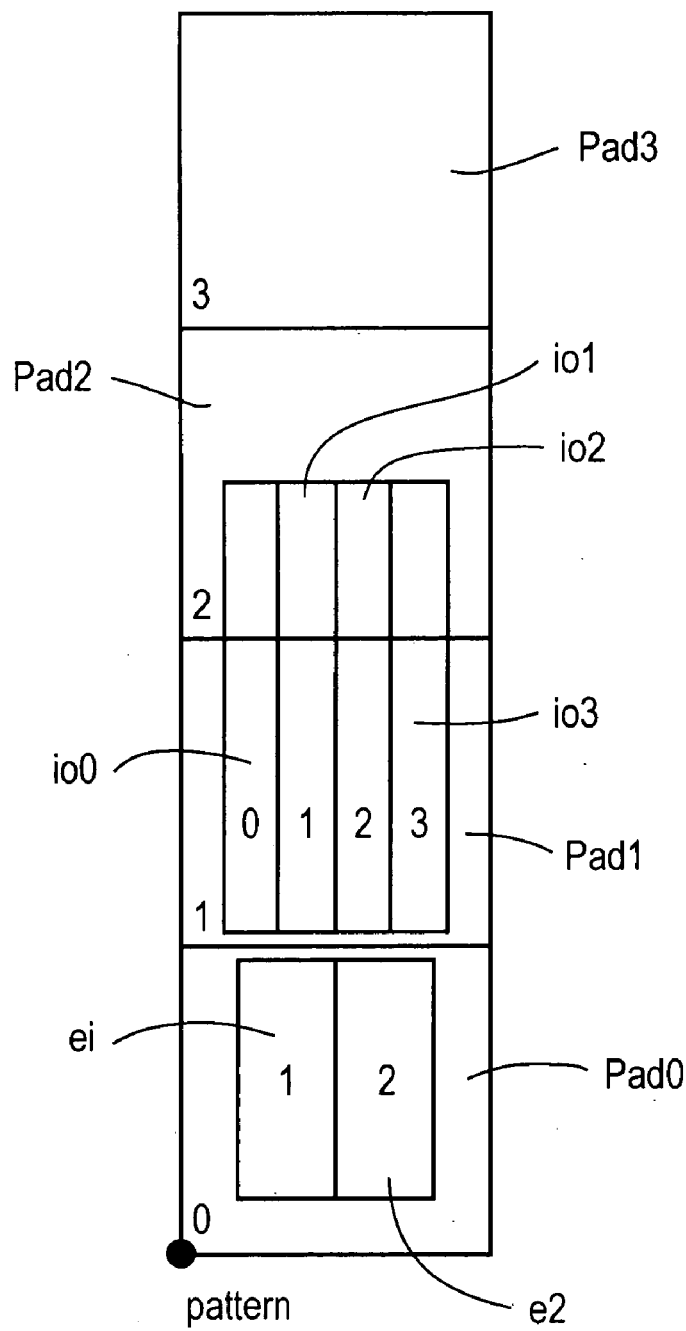
FIG. 11 illustrates a pattern in accordance with an embodiment of the present invention.

FIG. 11 illustrates a pattern 1100 in accordance with an embodiment of the present invention. A pattern 1100 describes/defines how one or more slots 500 (FIG. 5) fit together like a template. Here, the pattern 1100 defines four slots. A first slot is comprised of a bump/bond pad area Pad0 and an I/O area io0, but no edge logic area. A second slot is comprised of a bump/bond pad area Pad1, an I/O area io1, and an edge logic area e1. A third slot is comprised of a bump/bond pad area Pad2, an I/O area io2, and an edge logic area e2. A fourth slot is comprised of a bump/bond pad area Pad3 and an I/O area io3, but no edge logic area. Many different patterns can be formed.

Patterns 1100 are instantiated over areas of the chip called zones 680 (FIG. 6). The zones 680 describe the edges, corners, or core area of the chip based on a style 610–670 (FIG. 6). Each time a pattern 1100 is instantiated, the slots that the pattern 1100 define are also instantiated and then are marked with a slot name so they can be referenced and filled in with cells by a placer. The instantiation of slots is what fixes their bump/bond pad, I/O, and edge logic areas to a specific position in the padring area of the chip. The pattern 1100 is repeated for the various areas of the die based on the style. After the patterns 1100 are laid down in the zones to create the slots, the instantiated slots are used from then on, while the patterns can be stored in a library for use in future padring layout designs. It is possible to use many patterns in the same zone or concentric zones of concentric styles to achieve a complex population of slots.

Patterns 1100 and slots 500 (FIG. 5) are intrinsically spatially oriented. An editor is provided to create patterns 1100 of slots and rearrange the areas of slots inside the patterns 1100. In an embodiment, the editor is a GUI editor. Alternatively, the patterns 1100 can be written directly in perl or chosen from a library of preexisting patterns.

Simple padrings can make use of patterns 1100 also. For example, in wire-bond linear padrings, the bond pads can be staggered in order to reduce the pitch between I/O cells. A pattern of two slots could be used to describe this situation where one slot represents the inner bond pad and the other represents the outer bond pad. Repeating this pattern would yield a staggered effect in the bond pad positions.

Figure 12:
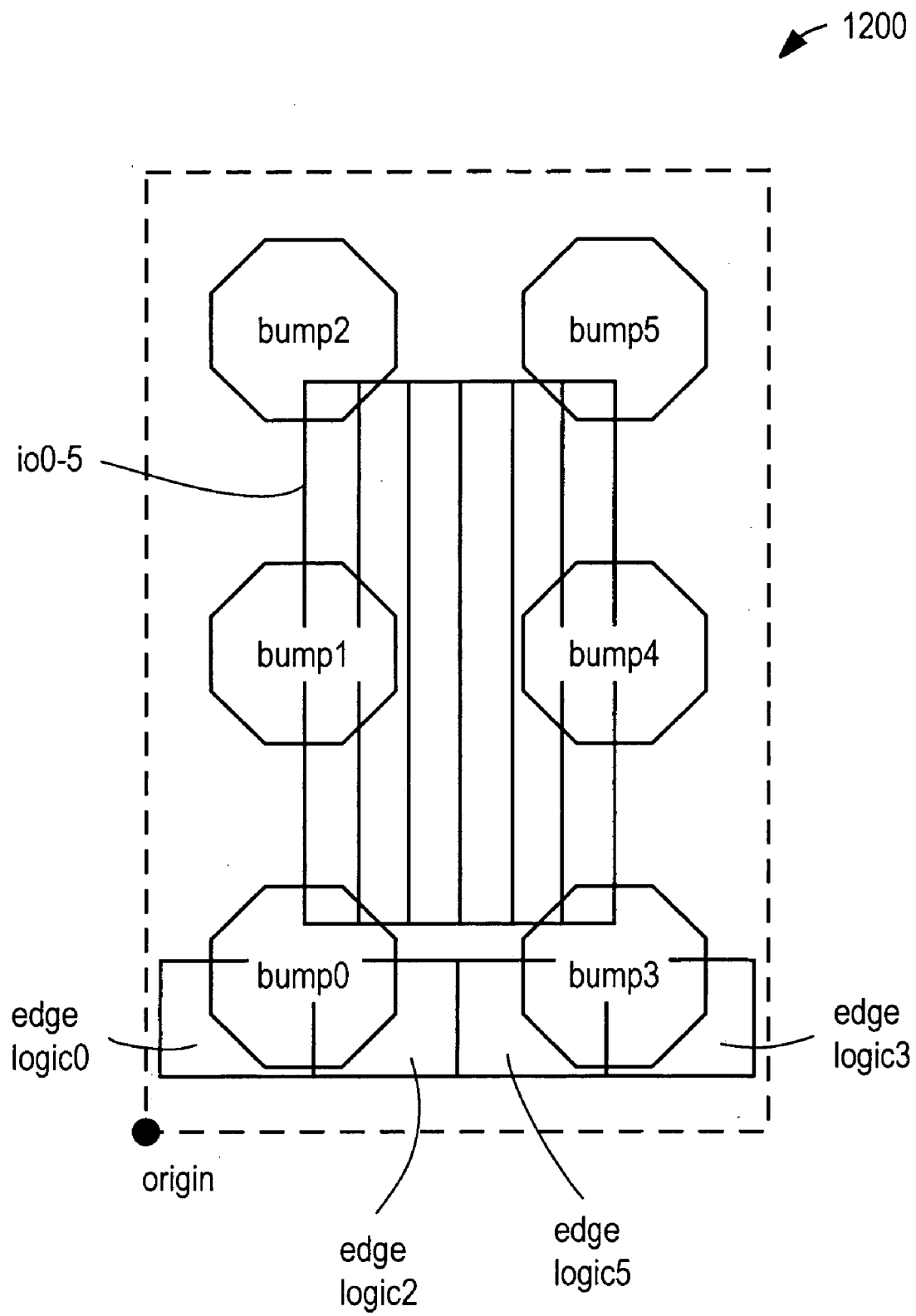
FIG. 12 illustrates a second pattern in accordance with an embodiment of the present invention.

FIG. 12 illustrates a second pattern 1200 in accordance with an embodiment of the present invention. Here, the second pattern 1200 defines six slots. A first slot is comprised of a bump area bump0, an I/O area io0, and an edge logic area edgelogic0. A second slot is comprised of a bump area bump1 and an I/O area io1, but no edge logic area. A third slot is comprised of a bump area bump2, an I/O area io2, and an edge logic area edgelogic2. A fourth slot is comprised of a bump area bump3, an I/O area io3, and an edge logic area edgelogic3. A fifth slot is comprised of a bump area bump4 and an I/O area io4, but no edge logic area. A sixth slot is comprised of a bump area bump5, an I/O area io5, and an edge logic area edgelogic5. Here, the second and fifth slots do not have edge logic areas since these slots are used for power and ground connections.

Figure 13:
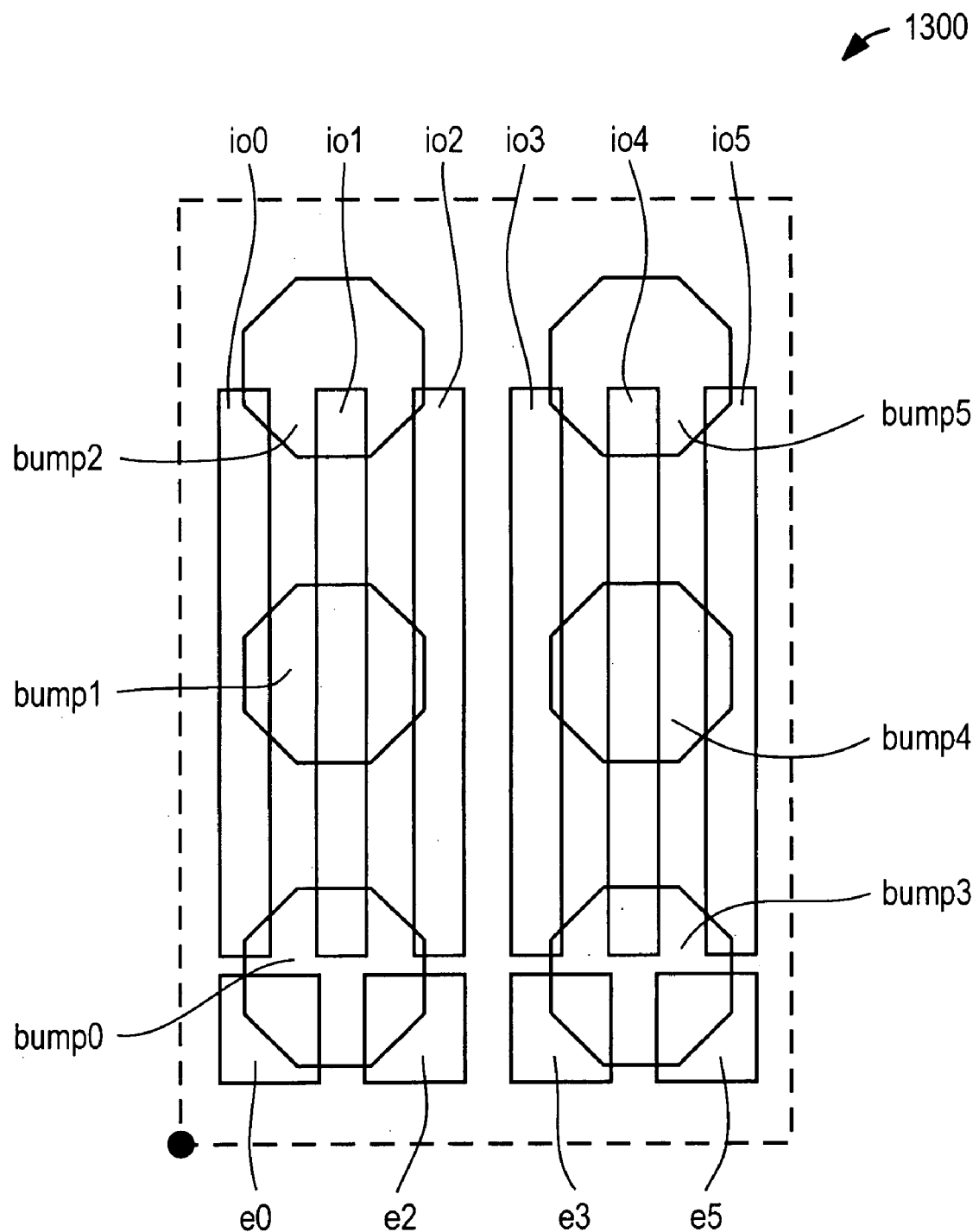
FIG. 13 illustrates a third pattern in accordance with an embodiment of the present invention.

FIG. 13 illustrates a third pattern 1300 in accordance with an embodiment of the present invention. Here, the third pattern 1300 defines six slots. A first slot is comprised of a bump area bump0, an I/O area io0, and an edge logic area e0. A second slot is comprised of a bump area bump1 and an I/O area io1, but no edge logic area. A third slot is comprised of a bump area bump2, an I/O area io2, and an edge logic area e2. A fourth slot is comprised of a bump area bump3, an I/O area io3, and an edge logic area e3. A fifth slot is comprised of a bump area bump4 and an I/O area io4, but no edge logic area. A sixth slot is comprised of a bump area bump5, an I/O area io5, and an edge logic area e5. Here, the second and fifth slots do not have edge logic areas since these slots are used for power and ground connections.

Although the second pattern 1200 and the third pattern 1300 each defines six slots, the I/O areas are positioned differently and the edge logic areas are positioned differently, demonstrating the variability in the formation of patterns.

Figure 14:
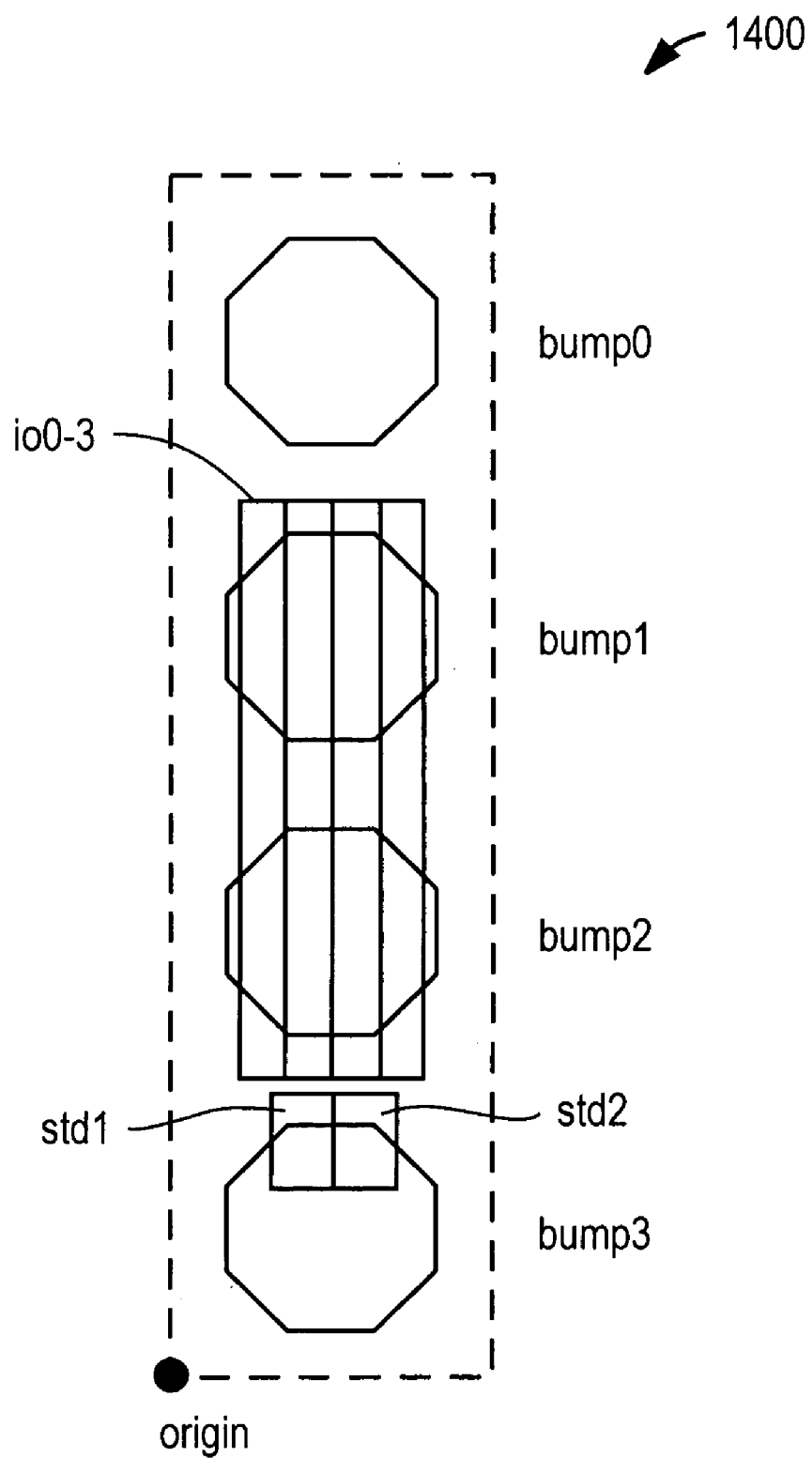
FIG. 14 illustrates a fourth pattern in accordance with an embodiment of the present invention.

FIG. 14 illustrates a fourth pattern in accordance with an embodiment of the present invention. Here, the fourth pattern 1400 defines four slots. A first slot is comprised of a bump area bump0 and an I/O area io0, but no edge logic area. A second slot is comprised of a bump area bump1, an I/O area io1, and an edge logic area std1. A third slot is comprised of a bump area bump2, an I/O area io2, and an edge logic area std2. A fourth slot is comprised of a bump area bump3 and an I/O area io3, but no edge logic area. Many different patterns can be formed.

Although the pattern 1100 and the fourth pattern 1400 each defines four slots, the I/O areas are positioned differently and the edge logic areas are positioned differently, again demonstrating the variability in the formation of patterns.

Figure 15:
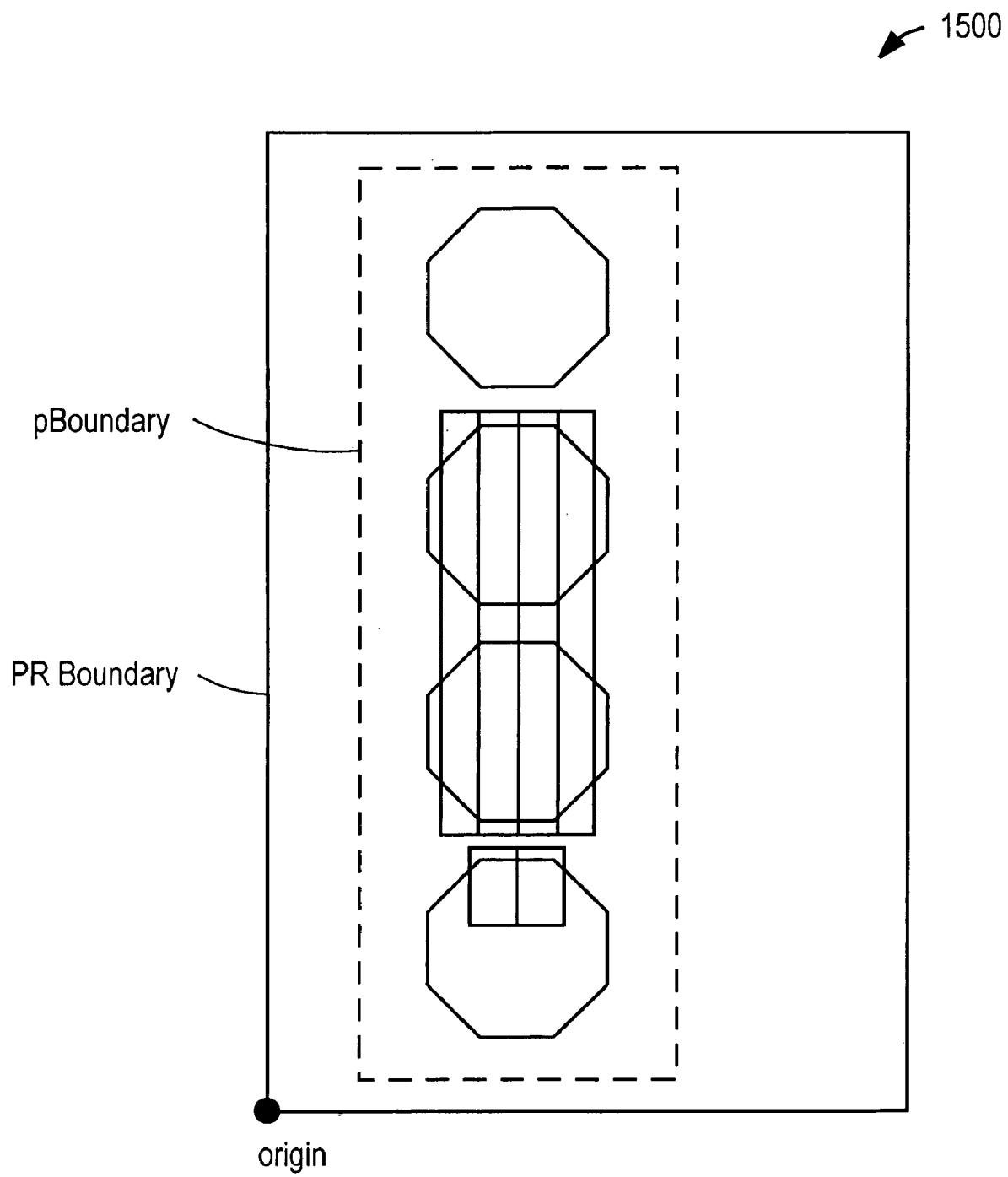
FIG. 15 illustrates several boundary attributes for a pattern in accordance with an embodiment of the present invention.

FIG. 15 illustrates several boundary attributes for a pattern 1500 in accordance with an embodiment of the present invention. The PR boundary is the box that encloses the entire pattern 1500 and can be abutted to the next pattern. The PR boundaries of two patterns cannot overlap in a legal placement. The pBoundary (physical boundary) is the minimum size box that encloses the areas related to a slot. It can be the same size or smaller than the PR Boundary. The PR boundary is used to allow arbitrary offsets on each side of the pBoundary for placement.

Figure 16:
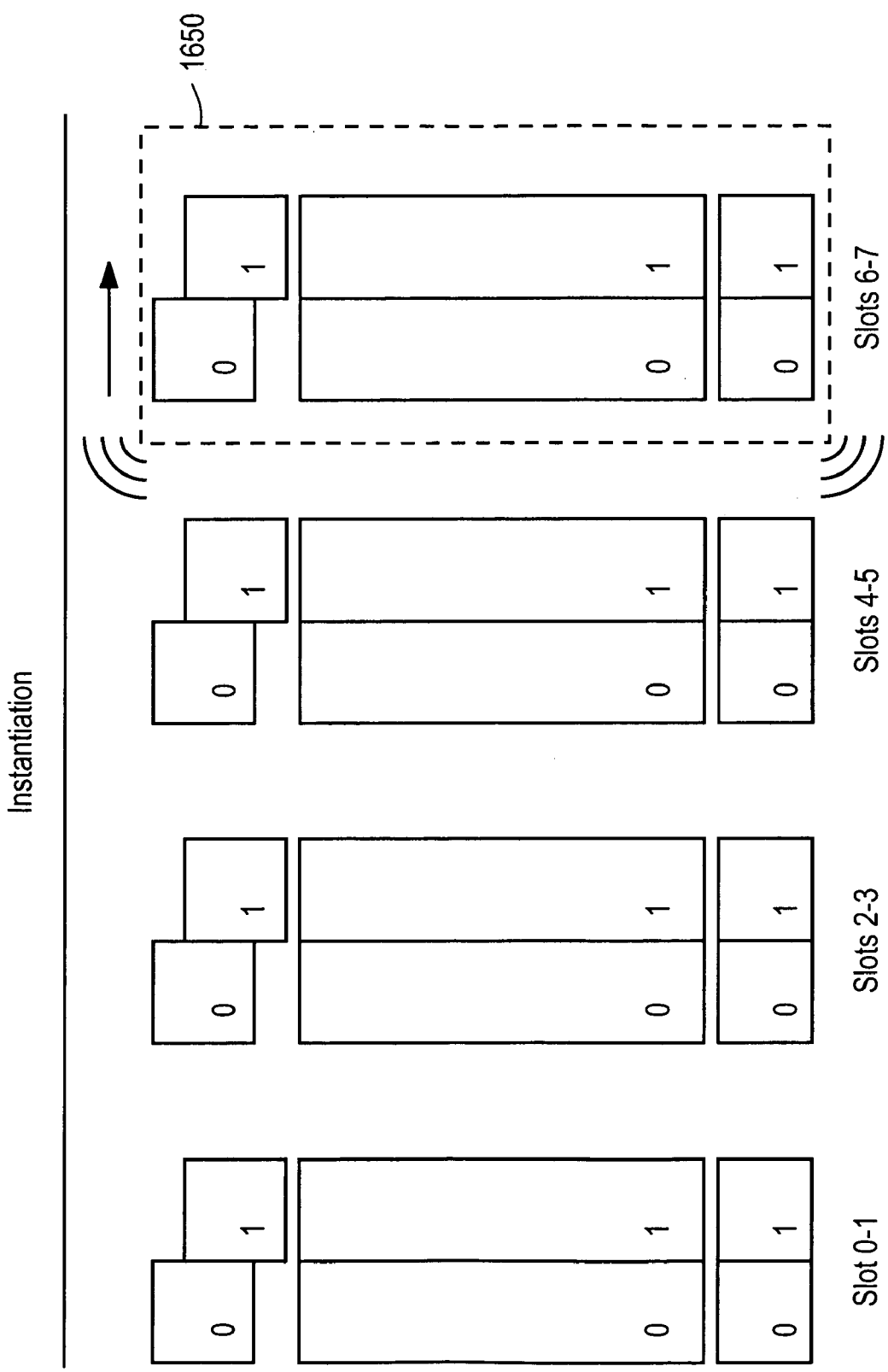
FIG. 16 illustrates a first instantiation in accordance with an embodiment of the present invention.

A first instantiation in accordance with an embodiment of the present invention is shown in FIG. 16 the process of creating slots 0–7 by using the pattern 1650 over and over again is called instantiation. The pattern 1650 is used to create slots 0–7 in a zone 680 (FIG. 6) of the padring area. The pattern 1650 is like a rubber stamp repeatedly used to stamp the slots 0–7 in each zone 680 (FIG. 6). The orientation and spacing of the pattern is taken into account during this instantiation process. For example, many linear padrings have different spacing rules for bond pads near a corner versus bond pads in the middle of an edge. The placement algorithm associated with the slot is chosen and configured based on the required spacing.

Figure 17:
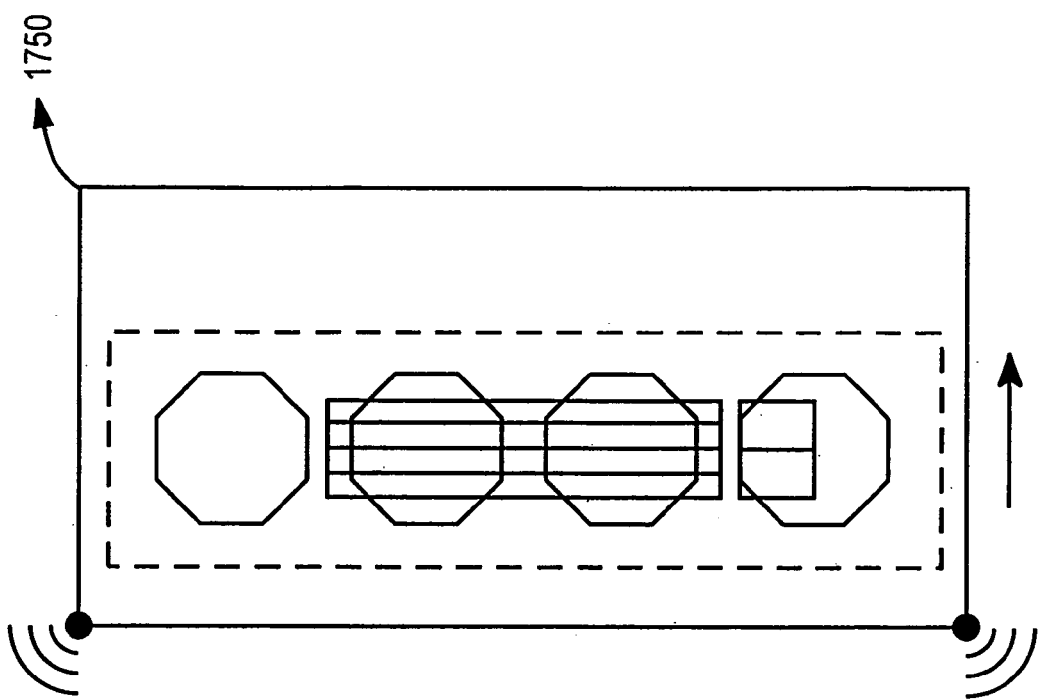
FIG. 17 illustrates a second instantiation in accordance with an embodiment of the present invention.
Figure 17:
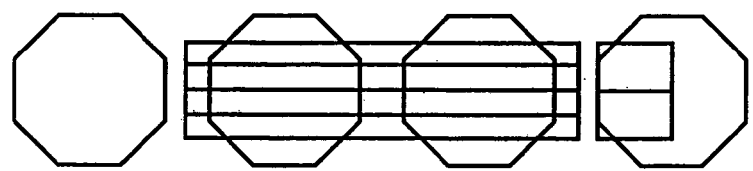
Figure 17:
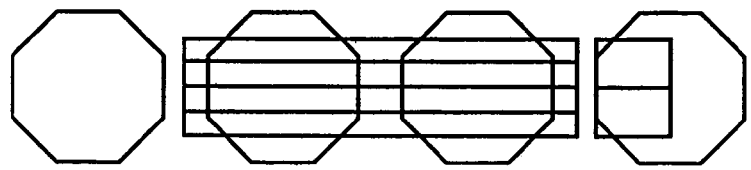
Figure 17:
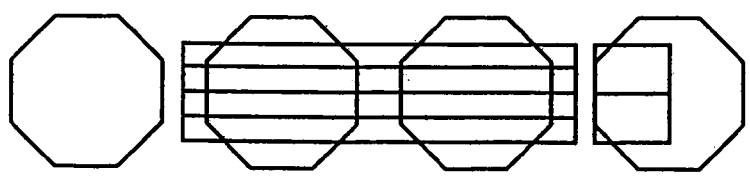

FIG. 17 illustrates a second instantiation in accordance with an embodiment of the present invention. In this second instantiation process, the pattern 1750 is used to create slots 0–15 in a zone 680 (FIG. 6) of the padring area.

Every padring layout design process has to define how the logical netlist and the physical bumps/bond pads are connected. Although a Verilog netlist cannot express it, this mapping is intrinsic to the design and is intimately associated with both the netlist and the package. A set of maps (e.g., bump/bond pad names map, I/O hints map, I/O map, and edge logic map) are carefully formulated to provide the required information in a way that does not introduce unnecessary dependencies between the design engineers producing the information. These maps are used for prototyping and the final sign-off and verification process. After the chip is placed and routed, the information contained in these maps can be reconstructed independently and compared to the input maps (initial maps). The coordinates of each bump/bond pad for use when wire-bonding or verifying the package will mate with the bump pattern can be determined and printed out.

Figure 18A:
FIG. 18A illustrates a bump/bond pad names map in a first format in accordance with an embodiment of the present invention.

A bump/bond pad names map 1800A in a first format in accordance with an embodiment of the present invention is depicted in FIG. 18A. A bump/bond pad names map 1800B in a second format in accordance with an embodiment of the present invention is shown in FIG. 18B. Other formats for the bump/bond pad names map are possible. In an embodiment, when slots are instantiated, they are given slot names that are numbers in the order they are created. This information may not be useful to the user and package vendor, since each has his own way of thinking about the pinout of the chip. The bump/bond pad names map 1800A and 1800B allows the various parties to rename slots with their own naming convention. The format of the map is flexible and can be quickly adapted to any format in which the information is available by using software such as perl. The bump/bond pad names map 1800A and 1800B can be used to text the bump/bond pad metal when it is placed. If the bump/bond pad names map 1800A and 1800B consists of top-level port names to the design, this text can be used during LVS to verify that the layout generated implements the netlist. By texting only the bumps/bond pads and no other metal, the chip can be accurately verified. Other bump/bond pad names maps can be created so that the bumps/bond pads can be given names such as logical names, functional names, or other types of names.

An I/O hints map 1900 in accordance with an embodiment of the present invention is illustrated in FIG. 19. Before concern about the package enters the picture in the padring layout process, the designers may not have considered the mapping of I/O cells to bumps/bond pads. In this case, a rough mapping can be provided so that floorplanning and partitioning experiments can proceed. This mapping is called the I/O hints map 1900. In an embodiment, the I/O hints map 1900 is comprised of regular expressions (in perl or sh (shell script), for example) of bump/bond pad names (or slot names) and regular expressions (in perl or sh (shell script), for example) describing I/O cells in the netlist. The regular expressions are used to form groups of slots and groups of I/O cells to be assigned to them. The specific assignment is not important, just generally that a group of I/O cells are assigned to a group of slots. This is useful to make sure signals are assigned to the correct side of the chip or that bused signals stay together. After an iteration of the padring layout design is generated and the I/O cells are assigned to a slot, the resulting assignment can be outputted and can be used as a basis for creating an accurate I/O map.

FIG. 20 illustrates an I/O map 2000 in accordance with an embodiment of the present invention. The I/O map 2000 describes which I/O cell is coupled with each bump/bond pad. It is an exact mapping. This is the map 2000 that connects the logical Verilog (specific I/O cell) with the physical die (specific bump/bond pad). This map 2000 determines the pinout of the chip. The format for the I/O map 2000 is flexible; the I/O cell name, net connecting to the bump, or the top-level Verilog port name can be used to specify which I/O cell to assign to a particular bump/bond pad. The evolution of an I/O hints map 1900 (FIG. 19) to the more accurate I/O map 2000 allows experimentation with pinouts to occur rapidly. It also allows other efforts such as floorplanning and partitioning to proceed in parallel. In this way, the logical netlist can be connected to the physical die in a way that reflects the maturity of the padring layout design.

FIG. 21 illustrates an edge logic map 2100 in accordance with an embodiment of the present invention. The edge logic map 2100 describes a group of standard cells that will be placed in an edge logic area of a slot near an I/O cell of the slot. Edge logic can be placed along the edges of the chip near the I/O cells but also in the core. When it is placed in the core, it is placed before the standard cells in the core are placed and so has preference over these cells. The placement of the edge logic is determined by the pattern. If the edge logic area of a slot inside a pattern overlaps with the core, the edge logic placed in that area will be in the core. Logically it belongs to the edge logic area but physically it can be anywhere on the chip specified by the pattern.

The edge logic map 2100 is used to tell which standard cells will be pulled from the core, repartitioned into the zones described above, and placed with the placement algorithm specified by the slots in the zones. The position of the edge logic can be placed in the core area even though logically it is in the edge logic area. The position of the edge logic is determined by the pattern. Since patterns can cover any area of the chip, the edge logic can be placed over any area of the chip. Moreover, the edge logic map 2100 is separate from the I/O map 2000 since packaging changes do not affect the association of logic with a certain I/O cell. The format for the edge logic map 2100 is flexible and regular expressions (in perl or sh (shell script), for example) can be used to describe entire levels or individual cells in the netlist. Note that the I/O map 2000 is split apart from the edge logic map 2100 because it is written by users concerned with the package and die pinout and routing. The split of information allows the pinout to change and not affect the assignment of edge logic (or standard cells) to a given I/O cell of a slot. Likewise, the netlist can be restructured and edge logic changed independent of the pinout of the chip.

Other formats for the maps described above are possible. One additional format is to group all the map information into one Excel spreadsheet for ease of use. This spreadsheet is then broken up into the four maps described above before use.

FIGS. 22A–22D illustrate a plurality of arrangements (or placement algorithms) for placing objects in accordance with an embodiment of the present invention. The placement algorithms (or arrangements) can be used to place cells in the bump/bond pad area, the I/O area, and the edge logic area of the slots. For example, the arrangement ulur (FIG. 22A) causes a placement of cells to begin at the upper left of an area and proceeds to the upper right of the area. At the end of a row, the placement returns to the left and proceeds to the right again. Other arrangements are possible.

Figure 23A:
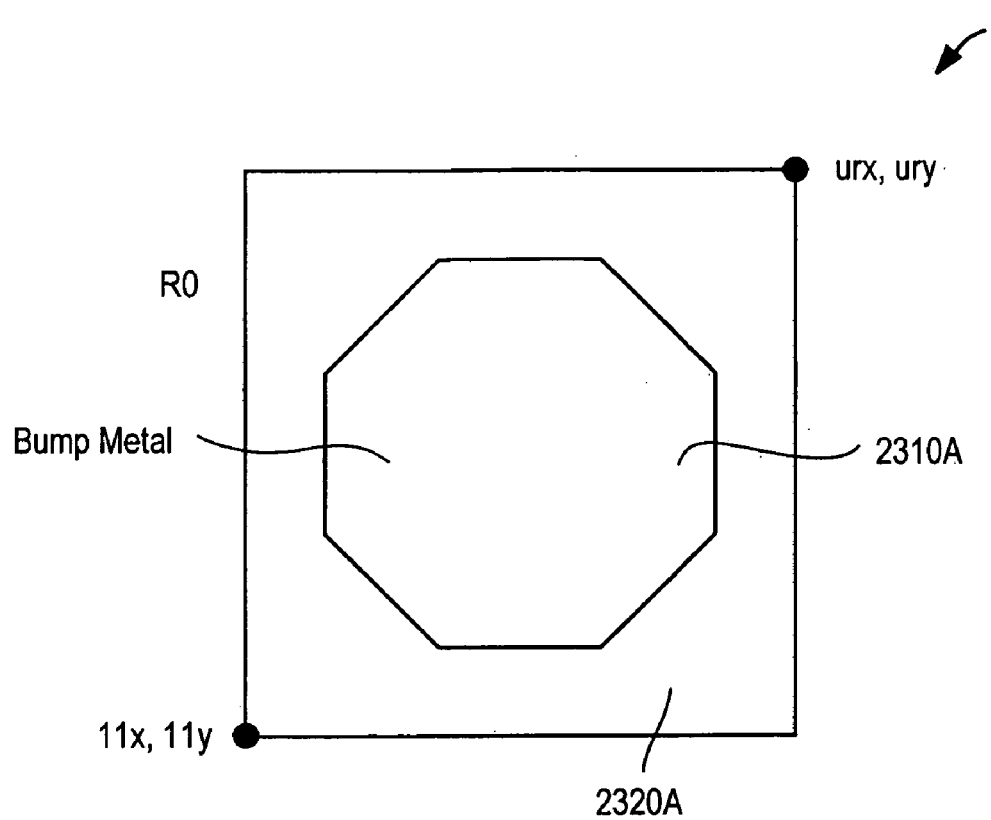
FIG. 23A illustrates a placement of a bump in a bump/bond pad area in accordance with an embodiment of the present invention.

A placement of a bump metal cell 2320A in a bump/bond pad area 2300A in accordance with an embodiment of the present invention is illustrated in FIG. 23A. Each slot can have a bump/bond pad area 2300A where the bump metal cell 2320A is placed. The bump/bond pad area 2300A has a location and an orientation. Here, the orientation is R0 (FIG. 8A). The bump metal cell 2320A has a PR Boundary (FIG. 1400) larger than the bump metal 2310A itself.

Figure 23B:
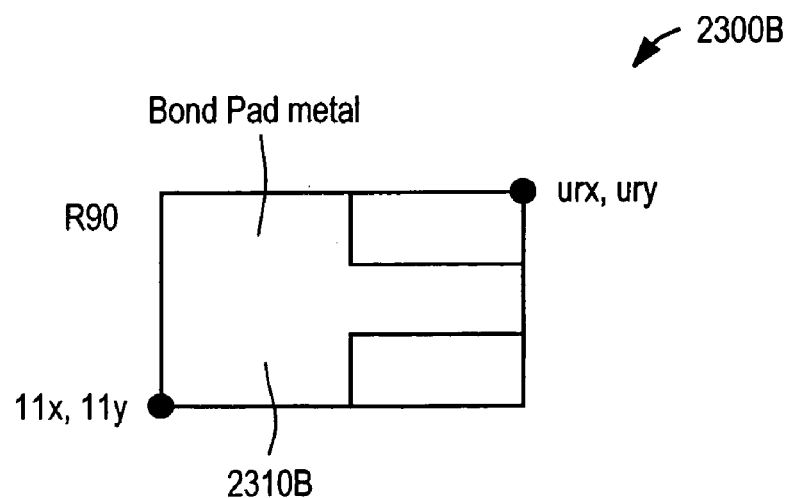
FIG. 23B illustrates a placement of a bond pad in a bump/bond pad area in accordance with an embodiment of the present invention.

A placement of a bond pad metal 2310B in a bump/bond pad area 2300B in accordance with an embodiment of the present invention is depicted in FIG. 23B. Each slot can have a bump/bond pad area 2300B where the bond pad metal 2310B is placed. The bump/bond pad area 2300B has a location and an orientation. Here, the orientation is R90 (FIG. 8A).

Figure 24:
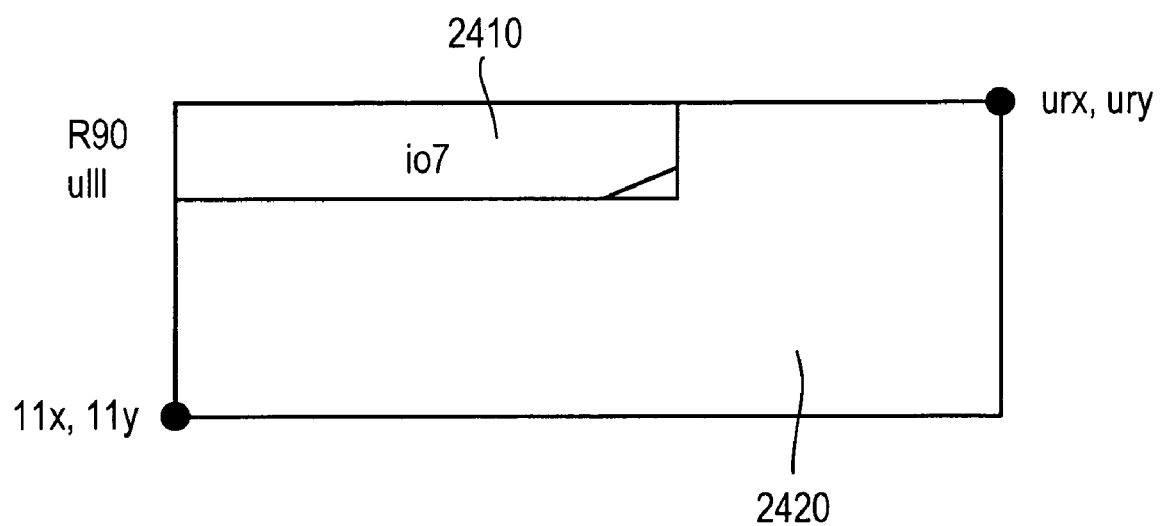
FIG. 24 illustrates a placement of I/O cell in an I/O area in accordance with an embodiment of the present invention.

FIG. 24 illustrates a placement of I/O cell 2410 in an I/O area 2420 in accordance with an embodiment of the present invention. Each slot can have an I/O area 2420 where one or more I/O cells can be placed. The I/O area 2420 can have a location, orientation, and arrangement. Here, the orientation is R90 (FIG. 8A) while the arrangement is ulll (FIG. 22C).

Figure 25:
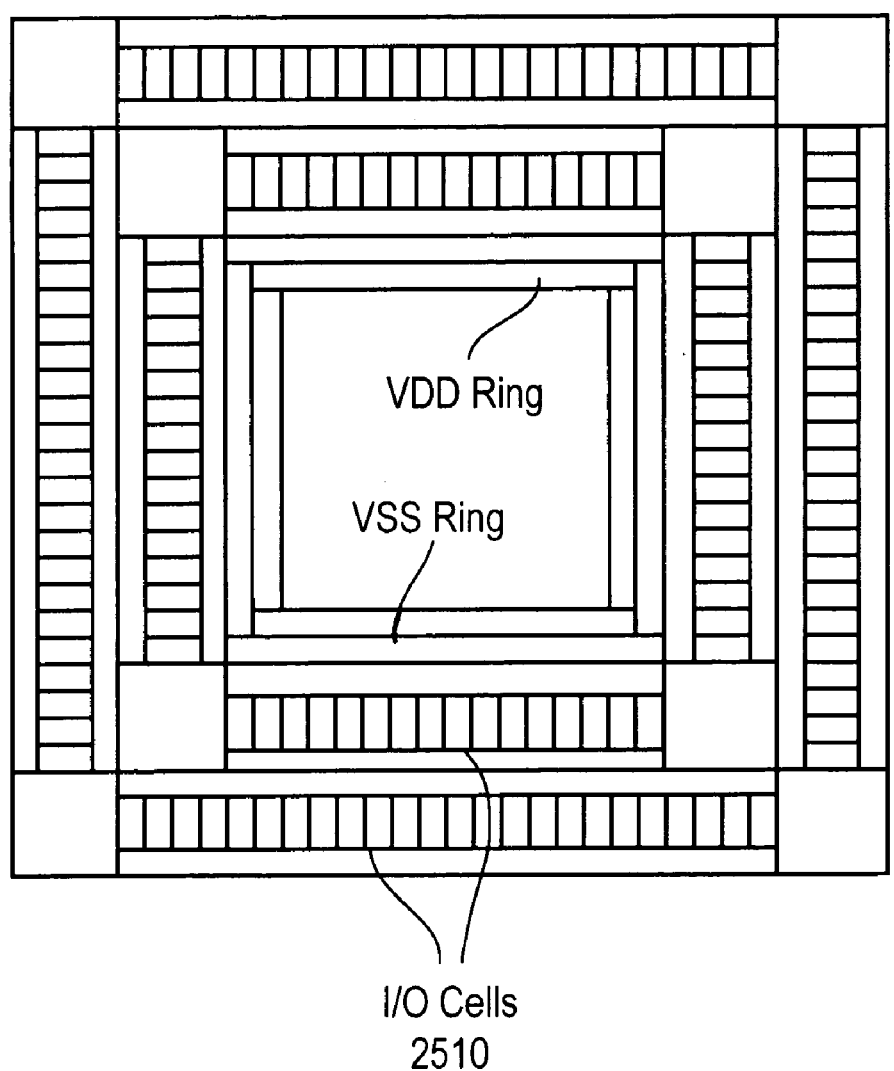
FIG. 25 illustrates a placement of I/O cells in the I/O areas of a padring layout design in accordance with an embodiment of the present invention.

FIG. 25 illustrates a placement of I/O cells 2510 in the I/O areas of a padring layout design 2500 in accordance with an embodiment of the present invention. Zones and patterns determine the location of the I/O cells 2510.

In one aspect of the present invention, standard cells called "edge logic" or "affinity logic" are grouped. Edge logic is a group of standard cells that have a timing relation with the I/O of the chip. Edge logic is often comprised of the first or last flip-flop connected directly to the I/O cell but can be as large as an entire FIFO for bringing data across clock domains. In an embodiment, edge logic is usually kept to fewer than 100 standard cells per I/O cell. The edge logic is placed in the edge logic area near each I/O cell of a slot for timing purposes. This addresses the time delay and variability in routes between the I/O cells and the core. Placing edge logic near the I/O cell instead of leaving it in the core shortens the distance between the I/O cell and the first/last flip flop, and how it is placed for related signals (e.g., a bus) can have a large impact on the skew for those signals.

In an embodiment, three options for placing edge logic in the edge logic area of a slot. The first option utilizes cell groups supported by timing driven placers. A group is formed covering the edge logic area for a slot and then the timing driven placer tries to place the edge logic for the I/O cell of the slot in the edge logic area. The placement is timing driven and varies from slot to slot but it is better than the variability of having the edge logic far away from the I/O cells in the core.

The second option to place edge logic in the edge logic area is to use a deterministic placer. A deterministic placer is not timing driven, it places standard cells in the edge logic area one at a time while packing them closely to their neighbors according to an arrangement. The order in which standard cells are placed is controlled by a sorting function assigned to the particular edge logic area. In this way, a series of edge logic areas can all have the same placement if the Verilog netlist has the same cells instantiated for each edge logic area. This is useful when trying to meet skew requirements between related I/O signals. Note that the placement is deterministic but the routing is still based on a heuristically driven router. The variations in routing of edge logic areas will be small because the placement is the same or approximately the same, however for extremely tight skew specifications (i.e. skew approaching 0) it will not be good enough.

To address a very tight skew specification, a macro is created in which the edge logic is placed and routed. The macro is then placed in the edge logic area in the same position with respect to respective I/O cells and will satisfy even the tightest skew constraints. In this way, both the placement and routing are tightly controlled. The extra effort to create a macro and associated timing library entry is weighed against the skew specification and is used only when justified. Moreover, multiple edge logic areas can be specified in a slot. This is useful for cases where the first/last flip-flop is to be placed close and consistently with respect to the I/O cell and other logic is to be placed nearby but is not so severely constrained.

Figure 26A:
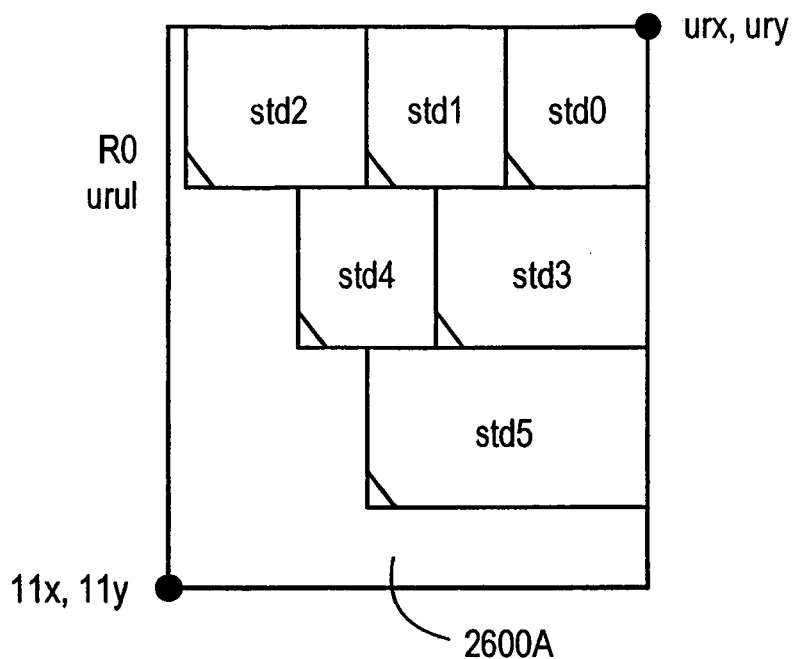
FIG. 26A illustrates a first placement of standard cells in an edge logic area in accordance with an embodiment of the present invention.

FIG. 26A illustrates a first placement of standard cells in an edge logic area 2600A in accordance with an embodiment of the present invention. Each slot can have an edge logic area 2600A where one or more standard cells can be placed. The edge logic area 2600A has a location, orientation, and arrangement additionally, the edge logic area 2600A can have an ordering function for sorting the standard cells. Here, the orientation is R0 (FIG. 8A) while the arrangement is urul (FIG. 22C). Moreover, a deterministic placer is used.

Figure 26B:
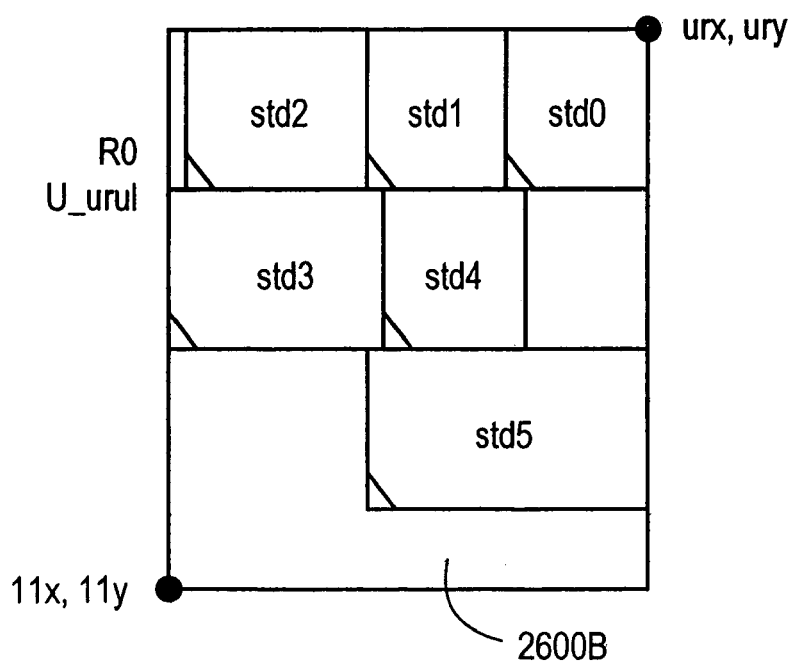
FIG. 26B illustrates a second placement of standard cells in an edge logic area in accordance with an embodiment of the present invention.

A second placement of standard cells in an edge logic area 2600B in accordance with an embodiment of the present invention is shown in FIG. 26B. Each slot can have an edge logic area 2600B where one or more standard cells can be placed. The edge logic area 2600B has a location, orientation, and arrangement. Additionally, the edge logic area 2600B can have an ordering function for sorting the standard cells. Here, the orientation is RO (FIG. 8A) while the arrangement is U_urul (FIG. 22D). Moreover, a deterministic placer is used.

Figure 27:
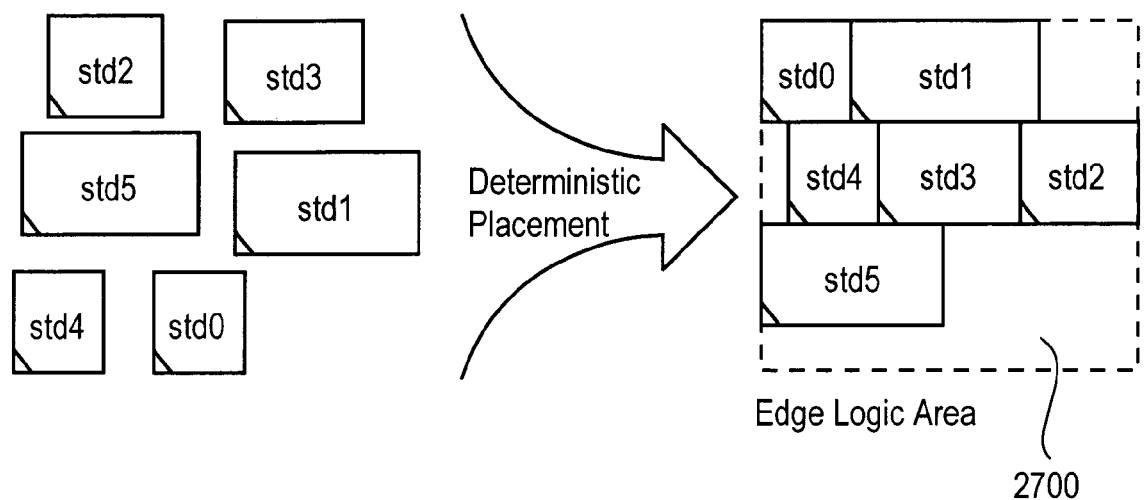
FIG. 27 illustrates a third placement of standard cells in an edge logic area in accordance with an embodiment of the present invention.

In FIG. 27, a third placement of standard cells in an edge logic area 2700 in accordance with an embodiment of the present invention is illustrated. The standard cells are sorted alphabetically and placed in an edge logic area 2700 using a deterministic placer. The orientation is RO (FIG. 8A) while the arrangement is U_ulur (FIG. 22B).

Moreover, FIG. 28A illustrates I/O cells 2810 and edge logic 2820 placement in a slot 2830 in accordance with an embodiment of the present invention. FIG. 28B illustrates a bump-to-I/O route cover cell 2800B in accordance with an embodiment of the present invention.

Figure 29:
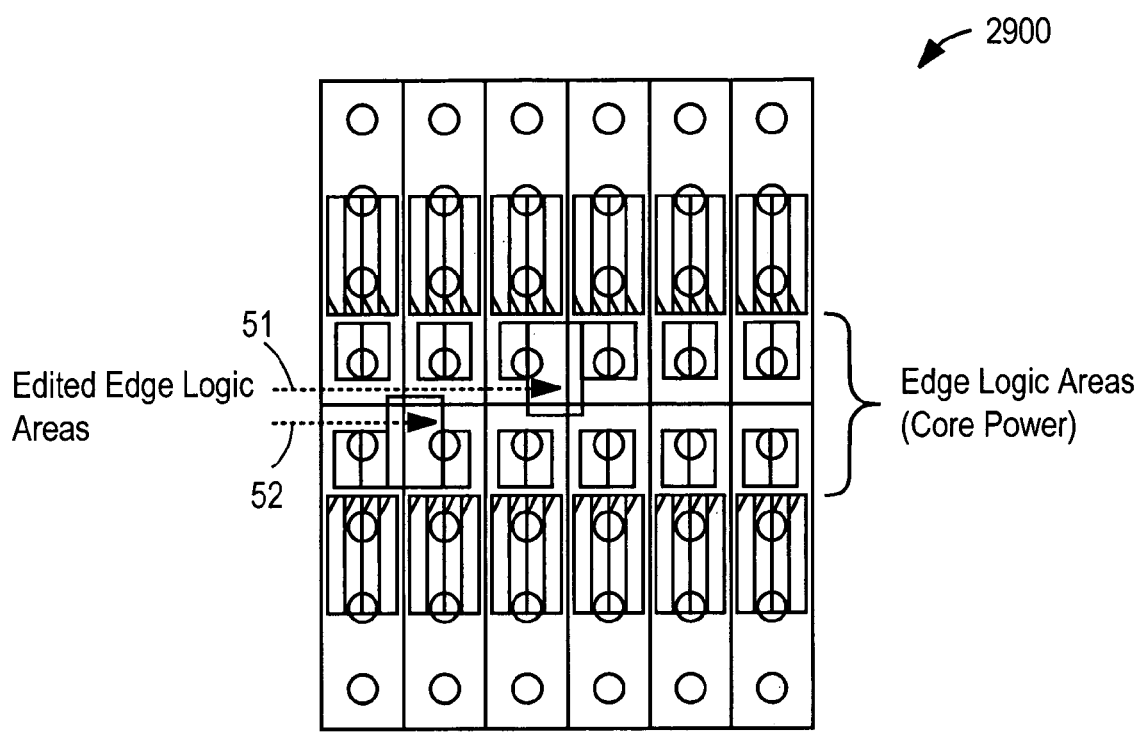
FIG. 29 illustrates customization of edge logic areas in accordance with an embodiment of the present invention.

Additionally, FIG. 29 illustrates customization of edge logic areas 51 and 52 of a padring layout design 2900 in accordance with an embodiment of the present invention. An editor is utilized to re-size the edge logic areas 51 and 52. Alternatively, a graphical user interface (GUI) can be used to re-size the edge logic areas 51 and 52. The editor can be used, for example, to modify the padring layout design, deleted unused slots, delete unused areas of slots, expand certain edge logic areas, resize some I/O areas for double and triple width I/O cells, and move edge logic areas out of inaccessible corner areas. Additionally customization for the padring layout design can include, for example, placing power grids and the PLL, routing the PLL power, generating the JTAG repeaters; producing an edge logic map addendum, and prerouting the shielded balanced-bus wires. In an embodiment, this customization can be performed using software such as per. Thus, the length of preroutes in the balanced buses and the repeatability of the edge logic placement are guaranteed.

The generation of a padring layout design is influenced by several preliminary considerations. One critical preliminary consideration is the number of signals and the signal to power/ground ratio for the chip design. If the signals can switch at a high rate, it is a good idea to have power and ground resources nearby to supply the current that the I/O cells will consume. How many power and ground resources are placed nearby can be described by the signal to power/ground ratio. For example, a high-speed output bus may have a power and ground pair for every two data signals for a ratio of 2:1. A lower speed interface may require a 4:1 or even 6:1 ratio. A low ratio indicates that the number of pins in the package will be greater but they will be interspersed with more power and ground pins so the package may actually be easier to route. Also, the number of pins to support the power requirements of the core needs to be considered.

In general, chip designs can be placed on a spectrum ranging from core-limited to pad-limited designs. A core-limited design occurs when the area required to place and route the core provides more than enough edge area for the padring. This type of chip design is often implemented with linear padrings since high pin density is not a concern. At the other end of the spectrum is a pad-limited design where the die size required to place the number of pins at a certain pitch creates a core area with more than enough room for the core. This is where the tradeoff between an expensive package with more substrate layers and smaller bump pitch versus a larger die comes into play. The present invention provides the ability to generate padring layout designs quickly, enabling estimation of core area and area utilization which is critical to the chip design process. This facilitates making package-related determinations early in the chip design process, allowing the package to be manufactured earlier than previously possible.

Figure 30A:
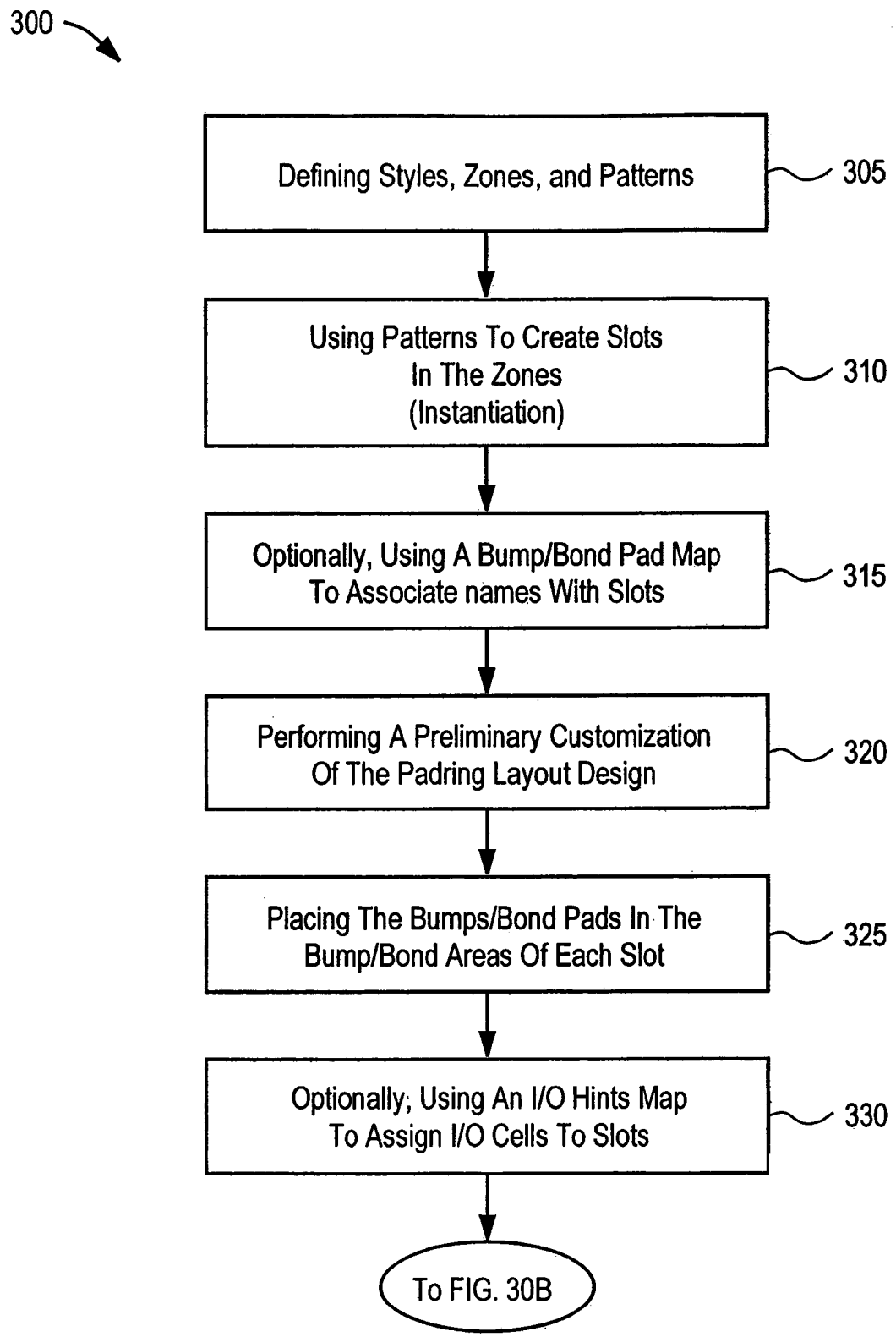
FIG. 30 illustrates a flow chart illustrating a method of generating a padring layout design in accordance with an embodiment of the present invention.
Figure 30B:
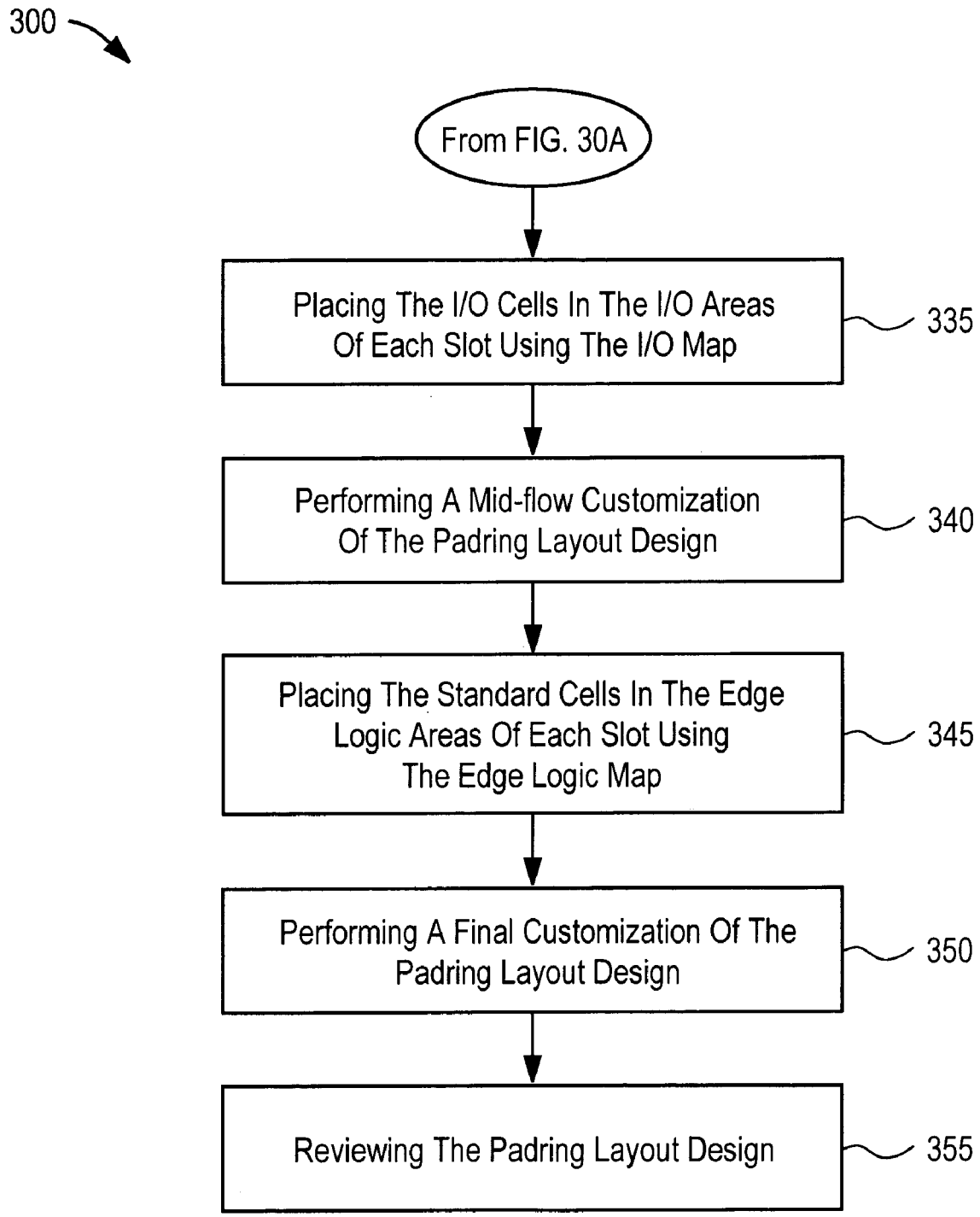

FIG. 30 illustrates a flow chart illustrating a method 300 of generating a padring layout design in accordance with an embodiment of the present invention. The automated approach of method 300 enables the quick generation of a padring layout design that satisfies a variety of packaging, timing, and electrical constraints. Reference is made to FIGS. 30A and 30B.

At Block 305 of FIG. 30A, styles, zones, and patterns are defined for the padring layout design. This ability to break down a desired padring layout design into parts (e.g., styles and zones) that utilize one or more patterns that are repeated fosters automation. A pattern can be formed using an editor. Moreover, the pattern can be formed using a graphical user interface (GUI). Also, a pattern can be defined using software such as perl. Moreover, the pattern can be defined by selecting a pattern from a library that stores previously generated patterns. The pattern describes the layout of one or more slots. A slot may have a bump/bond pad area, an I/O area, and/or an edge logic area. A style specifies how the padring area is divided into zones so that the multiple patterns can be used to populate the padring area with slots. A zone is an area of the padring in which a pattern is used to create slots using an instantiation process. Any layout regularity in the zone is determined and incorporated into the pattern for the zone. Moreover, the power grid for the edge logic needs to be taken in account. For a linear padring design, the edge logic is simply at the edge of the core power grid and the same grid is used. For a complex BGA padring design, the power grid may be comprised of a core area and rings of standard cell power grids near the I/O cells. The zones that the standard cell power is to cover are defined at this preliminary stage so that the patterns and power grid work together.

Continuing at Block 310, the patterns are then used to create slots in the zones using an instantiation process which is automated. A pattern is like a rubber stamp repeatedly used to stamp the slots in each zone. The orientation and spacing of the pattern is taken into account during this process. For example, many linear padrings have different spacing rules for bond pads near a corner versus bond pads in the middle of an edge. The placement algorithm associated with an instantiated slot is chosen and configured based on the required spacing. A power grid for the edge logic is then created depending on the configuration. For a BGA padring design where there may be many rows of I/O cells near the edge of the chip, the I/O cells have a tendency to cutoff the power grid for the edge logic from the core power grid. Here, straps can be automatically inserted over/between the I/O cells to provide connectivity between these grids.

Optionally at Block 315, a bump/bond pad name map can be used to associate names with the slots. These names can be used for LVS or for marking the bump/bond pads on plots for visual inspection. The I/O and edge logic maps can use these names also. The names can be written with a naming convention the user understands. Multiple bump/bond pad names can be associated with a given slot. This is useful in that sometimes a bump/bond pad is referenced spatially (e.g., B-17) and sometimes logically (e.g., ClkIn).

At Block 320, a preliminary customization of the padring layout design is performed. After the slots are laid out in the zones, a variety of modifications can be made. This preliminary customization can include, for example, editing slot positions to make room for exceptions to the patterns, deleting slots, introducing unique cell layouts into the padring layout design, and resizing areas of the slots. This can be performed using an editor. Moreover, this preliminary customization can be performed using a graphical user interface (GUI). Additionally, this preliminary customization can be performed programmatically using software such as perl.

Moreover, at Block 325, the bump/bond pad metals are placed in the bump/bond pad area of each slot. Often this metal is in the form of a cell that can be placed, but it can also be drawn directly if shapes and layers are provided in the slot.

Optionally, at Block 330, an I/O hints map can be used to assign I/O cells to slots. If the design is not mature and floorplanning/partitioning experimentation is needed, an I/O hints map can be provided at this point to roughly assign I/O cells to slots. Regular expressions (in perl or sh (shell script), for example) are used to group I/O cells and assign them to groups of slots. The signal to power/ground ratio is taken into account to intersperse signals with power/ground pairs. This I/O hints map can be used to quickly identify if a bus will wrap around a corner or if a given die area and pattern provides enough slots for the design. Once the groups of I/O cells are assigned to groups of slots, the assignment can be written out in the form of an I/O map.

Now referring to FIG. 30B, at Block 335, I/O cells are placed in the I/O area of each slot using the I/O map. The I/O map, which maps the logical netlist to physical bumps/bond pads, is read. I/O cells are placed in the I/O areas of the slots for which they are assigned. This determines the pinout of the chip. Nominally there is one I/O cell for each slot but variations are allowed. For example, multiple slots per I/O cell and multiple I/O cells per slot can be accommodated. Both cases are easily configured with the editor or GUI during the preliminary customization. The I/O area of the slot is usually created to be the exact size of the I/O cell but sometimes a family of I/Os will be different sizes. For this case, the placement algorithm associated with each I/O area is responsible for making sure each I/O cell is justified correctly within each I/O area.

At Block 340, a mid-flow customization of the padring layout design is performed. Here, unique layouts can be introduced into the padring layout design. For example, a JTAG scan loop can be stitched and have repeaters added or preroutes associated with the I/O cells can be laid out (e.g., voltage references, temperature or impedance compensation signals). This can be performed using software such as perl and a library.

Moreover, at Block 345, standard cells are placed in the edge logic area of each slot using the edge logic map. The edge logic map is read. Groups of standard cells are collected and ordered as prescribed by the attributes of the edge logic area for each slot. If edge logic belongs to a bus in general and not to a bit in particular, an edge logic area can be edited to cover the desired region associated with the bus. One of three placement algorithms is associated with each edge logic area. The first placement algorithm is a placement region where the edge logic is placed in the area by a timing driven placer. This will place edge logic near the I/O cell in a timing driven manner. The second placement algorithm for edge logic placement is to use a deterministic placer. This placer will guarantee consistent placement for each edge logic area. Since the deterministic placer controls only the placement, there can still be variability in the routing. For cases where the routing in the edge logic area is to be controlled also, the third placement algorithm is used. Here, a macro is constructed (such that the edge logic is placed and routed) and placed in each edge logic area to guarantee absolute consistency between related edge logic areas.

At Block 350, a final customization of the padring layout design is performed. This final customization can include, for example, laying down special escape pattern cover cells and adding prerouted wires near the edge logic areas to provide a bus with shielding for low skew balanced buses. This is useful for source-synchronous buses where consistent loading on the data and clock lines is important to achieve a low skew specification. Another final customization is to add repeaters on long nets.

At Block 355, the padring layout design is reviewed. Since automation is utilized, the padring layout design can be reviewed, changed, and regenerated multiple times until a satisfactory padring layout design is achieved. The padring layout design can be visually inspected, plots can be made, and the initial and final versions of maps (e.g., I/O map) can be compared. This short edit-run-evaluate cycle facilitates generating multiple iterations of the padring layout design in an efficient manner.

In summary, a given padring layout design is comprised of several zones which exhibit some regularity. This regularity can be exploited by finding the pattern in each zone and capturing it. The pattern is used to create areas where bump/bond pad, I/O, and edge logic cells are placed. Edge logic is pulled from the core (repartitioning) and placed near each I/O cell (placement). The areas can be edited to accommodate deviations from the pattern. Maps are used to assign names to these areas and to assign I/O and edge logic cells to specific areas. The content of the maps is designed to promote concurrency between engineers tasked with package design, netlist construction, floorplanning, and partitioning. The maps have a flexible format that can change as the pinout evolves from a prototype to final sign-off. The repeatable placement of edge logic near each I/O cell allows control over timing. Moreover, a flexible approach to customizing layout is provided. In this manner, small and large changes can be made easily and accurately. The short edit-run-evaluate loop allows changes to be made quickly, thus speeding design time. Finally, provisions are made for formal verification and LVS/DRC to check the resulting padring layout design.

Those skilled in the art will recognize that portions of the present invention may be incorporated as computer instructions stored as computer program code on a computer-readable medium such as a magnetic disk, CD-ROM, and other media common in the art or that may yet be developed.

Finally, aspects of the present invention can be implemented as an application, namely, a set of instructions (e.g., program code) which may, for example, be resident in the random access memory of a computer system. Until required by the computer system, the set of instructions may be stored in another computer memory, for example, in a hard drive, or in a removable memory such as an optical disk (for eventual use in a CD-ROM) or floppy disk (for eventual use in a floppy disk drive), or downloaded via the Internet or other computer network. In addition, although the various methods of the present invention described above can be conveniently implemented in a computer system selectively activated or reconfigured by software, one of ordinary skill in the art would also recognize that such methods of the present invention may be carried out in hardware, firmware, or in a more specialized apparatus constructed to perform the required methods of the present invention.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of generating a padring layout design for a chip design, comprising:
    (a) defining one or more styles for said padring layout design, each style comprising one or more zones each representing a portion of said padring layout design;
    (b) defining one or more patterns for said one or more zones, wherein each pattern represents a template for one or more slots each comprising one or more areas, each slot describing placement of at least one of a pad metal, an I/O cell, and a standard cell within the one or more areas;
    (c) using each pattern in an instantiation process to create said slots in a respective zone, wherein said instantiation process associates each area of each slot with a particular location in said respective zone;
    (d) placing edge logic in selective areas of said slots, wherein said edge logic represents one or more standard cells which are associated with the I/O cell; and
    (e) performing said step d) using one of a plurality of placement algorithms based on a timing constraint associated with said chip design.

2. The method as recited in claim 1 wherein one of said areas comprises a bump area for placing a bump.

3. The method as recited in claim 1 wherein one of said areas comprises a bond pad area for placing a bond pad.

4. The method as recited in claim 1 wherein one of said areas comprises an I/O area for placing one or more I/O cells.

5. The method as recited in claim 1 wherein one of said areas comprises an edge logic area for placing said edge logic.

6. The method as recited in claim 5 wherein said edge logic area overlaps a core region of said chip design.

7. The method as recited in claim 1 wherein said step b) comprises: forming said pattern using an editor.

8. The method as recited in claim 1 wherein said step b) comprises: forming said pattern using a graphical user interface (GUI).

9. The method as recited in claim 1 wherein said step b) comprises: selecting said pattern from a library comprising a plurality of previously generated patterns.

10. The method as recited in claim 1 wherein said step b) comprises: defining said pattern with a software program.

11. The method as recited in claim 1 wherein said padring layout design is a linear padring layout design.

12. The method as recited in claim 1 wherein said padring layout design is a BGA padring layout design.

13. The method as recited in claim 1 wherein said plurality of placement algorithms includes a timing driven placement algorithm.

14. The method as recited in claim 1 wherein said plurality of placement algorithms includes a deterministic placement algorithm.

15. The method as recited in claim 1 wherein said plurality of placement algorithms includes a macro representing a predefined placement and a predefined route.

16. A method of generating a padring layout design for a chip design, comprising:
    (a) defining one or more styles for said padring layout design, each style comprising one or more zones each representing a portion of said padring layout design;
    (b) defining one or more patterns for said one or more zones, wherein each pattern represents a template for one or more slots each comprising one or more areas, each slot describing placement of at least one of a pad metal, an I/O cell, and a standard cell within the one or more areas;
    (c) using each pattern in an instantiation process to create said slots in a respective zone, wherein said instantiation process associates each area of each slot with a particular location in said respective zone;
    (d) customizing said padring layout design;
    (e) placing edge logic in selective areas of said slots, wherein said edge logic represents one or more standard cells which are associated with an I/O cell; and
    (f) performing said step e) using one of a plurality of placement algorithms based on a timing constraint associated with said chip design.

17. The method as recited in claim 16 wherein one of said areas comprises a bump area for placing a bump.

18. The method as recited in claim 16 wherein one of said areas comprises a bond pad area for placing a bond pad.

19. The method as recited in claim 16 wherein one of said areas comprises an I/O area for placing one or more I/O cells.

20. The method as recited in claim 16 wherein one of said areas comprises an edge logic area for placing said edge logic.

21. The method as recited in claim 20 wherein said edge logic area overlaps a core region of said chip design.

22. The method as recited in claim 16 wherein said step b) comprises: forming said pattern using an editor.

23. The method as recited in claim 16 wherein said step b) comprises: forming said pattern using a graphical user interface (GUI).

24. The method as recited in claim 16 wherein said step b) comprises: selecting said pattern from a library comprising a plurality of previously generated patterns.

25. The method as recited in claim 16 wherein said step b) comprises: defining said pattern with a software program.

26. The method as recited in claim 16 wherein said padring layout design is a linear padring layout design.

27. The method as recited in claim 16 wherein said padring layout design is a BGA padring layout design.

28. The method as recited in claim 16 wherein said plurality of placement algorithms includes a timing driven placement algorithm.

29. The method as recited in claim 16 wherein said plurality of placement algorithms includes a deterministic placement algorithm.

30. The method as recited in claim 16 wherein said plurality of placement algorithms includes a macro representing a predefined placement and a predefined route.

31. A computer system comprising:
    a processor; and
    a memory device coupled to said processor, wherein said memory device comprises computer-executable instructions stored therein for performing a method of generating a padring layout design for a chip design, comprising:
(a) defining one or more styles for said padring layout design, each style comprising one or more zones each representing a portion of said padring layout design;
(b) defining one or more patterns for said one or more zones, wherein each pattern represents a template for one or more slots each comprising one or more areas, each slot describing placement of at least one of a pad metal, an I/O cell, and a standard cell within the one or more areas;
(c) using each pattern in an instantiation process to create said slots in a respective zone, wherein said instantiation process associates each area of each slot with a particular location in said respective zone;
(d) placing edge logic in selective areas of said slots, wherein said edge logic represents one or more standard cells which are associated with an I/O cell; and
(e) performing said step d) using one of a plurality of placement algorithms based on a timing constraint associated with said chip design.

32. The computer system as recited in claim 31 wherein one of said areas comprises a bump area for placing a bump.

33. The computer system as recited in claim 31 wherein one of said areas comprises a bond pad area for placing a bond pad.

34. The computer system as recited in claim 31 wherein one of said areas comprises an I/O area for placing one or more I/O cells.

35. The computer system as recited in claim 31 wherein one of said areas comprises an edge logic area for placing said edge logic.

36. The computer system as recited in claim 35 wherein said edge logic area overlaps a core region of said chip design.

37. The computer system as recited in claim 31 wherein said step b) comprises:
forming said pattern using an editor.

38. The computer system as recited in claim 31 wherein said step b) comprises:
forming said pattern using a graphical user interface (GUI).

39. The computer system as recited in claim 31 wherein said step b) comprises:
selecting said pattern from a library comprising a plurality of previously generated patterns.

40. The computer system as recited in claim 31 wherein said step b) comprises:
defining said pattern with a software program.

41. The computer system as recited in claim 31 wherein said padring layout design is a linear padring layout design.

42. The computer system as recited in claim 31 wherein said padring layout design is a BGA padring layout design.

43. The computer system as recited in claim 31 wherein said plurality of placement algorithms includes a timing driven placement algorithm.

44. The computer system as recited in claim 31 wherein said plurality of placement algorithms includes a deterministic placement algorithm.

45. The computer system as recited in claim 31 wherein said plurality of placement algorithms includes a macro representing a predefined placement and a predefined route.

46. A computer system comprising:
a processor; and
a memory device coupled to said processor, wherein said memory device comprises computer-executable instructions stored therein for performing a method of generating a padring layout design for a chip design, comprising:
(a) defining one or more styles for said padring layout design, each style comprising one or more zones each representing a portion of said padring layout design;
(b) defining one or more patterns for said one or more zones, wherein each pattern represents a template for one or more slots each comprising one or more areas, each slot describing placement of at least one of a pad metal, an I/O cell, and a standard cell within the one or more areas;
(c) using each pattern in an instantiation process to create said slots in a respective zone, wherein said instantiation process associates each area of each slot with a particular location in said respective zone;
(d) customizing said padring layout design;
(e) placing edge logic in selective areas of said slots, wherein said edge logic represents one or more standard cells which are associated with an I/O cell; and
(f) performing said step e) using one of a plurality of placement algorithms based on a timing constraint associated with said chip design.

47. The computer system as recited in claim 46 wherein one of said areas comprises a bump area for placing a bump.

48. The computer system as recited in claim 46 wherein one of said areas comprises a bond pad area for placing a bond pad.

49. The computer system as recited in claim 46 wherein one of said areas comprises an I/O area for placing one or more I/O cells.

50. The computer system as recited in claim 46 wherein one of said areas comprises an edge logic area for placing said edge logic.

51. The computer system as recited in claim 50 wherein said edge logic area overlaps a core region of said chip design.

52. The computer system as recited in claim 46 wherein said step b) comprises: forming said pattern using an editor.

53. The computer system as recited in claim 46 wherein said step b) comprises: forming said pattern using a graphical user interface (GUI).

54. The computer system as recited in claim 46 wherein said step b) comprises:
selecting said pattern from a library comprising a plurality of previously generated patterns.

55. The computer system as recited in claim 46 wherein said step b) comprises:
defining said pattern with a software program.

56. The computer system as recited in claim 46 wherein said padring layout design is a linear padring layout design.

57. The computer system as recited in claim 46 wherein said padring layout design is a BGA padring layout design.

58. The computer system as recited in claim 46 wherein said plurality of placement algorithms includes a timing driven placement algorithm.

59. The computer system as recited in claim 46 wherein said plurality of placement algorithms includes a deterministic placement algorithm.

60. The computer system as recited in claim 46 wherein said plurality of placement algorithms includes a macro representing a predefined placement and a predefined route.

61. A method of generating a padring layout design for a chip design, comprising:
- defining one or more styles for said padring layout design, each style comprising one or more zones each representing a portion of said padring layout design;
- defining one or more patterns for said one or more zones, wherein each pattern represents a template for one or more slots each comprising one or more areas, one of said areas comprises an edge logic area for placing said edge logic, said edge logic area overlaps a core region of said chip design;
- using each pattern in an instantiation process to create said slots in a respective zone, wherein said instantiation process associates each area of each slot with a particular location in said respective zone;
- placing edge logic in selective areas of said slots, wherein said edge logic represents one or more standard cells which are associated with an I/O cell; and
- performing said placing using one of a plurality of placement algorithms based on a timing constraint associated with said chip design.

62. A method of generating a padring layout design for a chip design, comprising:
- defining one or more styles for said padring layout design, each style comprising one or more zones each representing a portion of said padring layout design;
- defining one or more patterns for said one or more zones, wherein each pattern represents a template for one or more slots each comprising one or more areas, one of said areas comprises an edge logic area for placing said edge logic, said edge logic area overlaps a core region of said chip design;
- using each pattern in an instantiation process to create said slots in a respective zone, wherein said instantiation process associates each area of each slot with a particular location in said respective zone;
- customizing said padring layout design;
- placing edge logic in selective areas of said slots, wherein said edge logic represents one or more standard cells which are associated with an I/O cell; and
- performing said placing using one of a plurality of placement algorithms based on a timing constraint associated with said chip design.

63. A computer system comprising:
a processor; and
a memory device coupled to said processor, wherein said memory device comprises computer-executable instructions stored therein for performing a method of generating a padring layout design for a chip design, comprising:
- defining one or more styles for said padring layout design, each style comprising one or more zones each representing a portion of said padring layout design;
- defining one or more patterns for said one or more zones, wherein each pattern represents a template for one or more slots each comprising one or more areas;
- using each pattern in an instantiation process to create said slots in a respective zone, wherein said instantiation process associates each area of each slot with a particular location in said respective zone, wherein one of said areas comprises an edge logic area for placing said edge logic, edge logic area overlaps a core region of said chip design;
- placing edge logic in selective areas of said slots, wherein said edge logic represents one or more standard cells which are associated with an I/O cell; and
- performing said placing using one of a plurality of placement algorithms based on a timing constraint associated with said chip design.

64. A computer system comprising:
a processor; and
a memory device coupled to said processor, wherein said memory device comprises computer-executable instructions stored therein for performing a method of generating a padring layout design for a chip design, comprising:
- defining one or more styles for said padring layout design, each style comprising one or more zones each representing a portion of said padring layout design;
- defining one or more patterns for said one or more zones, wherein each pattern represents a template for one or more slots each comprising one or more areas, one of said areas comprises an edge logic area for placing said edge logic, said edge logic area overlaps a core region of said chip design;
- using each pattern in an instantiation process to create said slots in a respective zone, wherein said instantiation process associates each area of each slot with a particular location in said respective zone;
- customizing said padring layout design;
- placing edge logic in selective areas of said slots, wherein said edge logic represents one or more standard cells which are associated with an I/O cell; and
- performing said placing using one of a plurality of placement algorithms based on a timing constraint associated with said chip design.

* * * * *